(12) United States Patent
Choi et al.

(10) Patent No.: US 12,532,747 B2
(45) Date of Patent: Jan. 20, 2026

(54) SEMICONDUCTOR PACKAGE AND PACKAGE-ON-PACKAGE HAVING DIFFERENT WIRING INSULATING LAYERS SURROUNDING DIFFERENTIAL SIGNAL WIRING LAYERS

(71) Applicant: SAMSUNG ELECTRONICS CO., LTD., Suwon-si (KR)

(72) Inventors: Juyoun Choi, Suwon-si (KR); Seongho Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 485 days.

(21) Appl. No.: 18/075,878

(22) Filed: Dec. 6, 2022

(65) Prior Publication Data

US 2023/0317640 A1    Oct. 5, 2023

(30) Foreign Application Priority Data

Mar. 29, 2022  (KR) .......................... 10-2022-0039177

(51) Int. Cl.
*H01L 23/64* (2006.01)
*H01L 23/498* (2006.01)
(Continued)

(52) U.S. Cl.
CPC ........ *H01L 23/64* (2013.01); *H01L 23/49822* (2013.01); *H01L 23/49838* (2013.01);
(Continued)

(58) Field of Classification Search
CPC ............... H01L 23/64; H01L 23/49822; H01L 23/49838; H01L 25/105
See application file for complete search history.

(56) References Cited

U.S. PATENT DOCUMENTS 9,331,370 B1 * 5/2016 Jiang ...................... H01P 3/082
9,520,373 B2   12/2016 Kim et al.
(Continued)

FOREIGN PATENT DOCUMENTS

JP    2004-265981 A    9/2004
JP    2009-38341 A     2/2009
(Continued)

OTHER PUBLICATIONS

Communication issued on Sep. 23, 2025 by the Korean Intellectual Property Office in Korean Patent Application No. 10-2022-0039177.

*Primary Examiner* — Michael Jung
(74) *Attorney, Agent, or Firm* — Sughrue Mion, PLLC

(57) ABSTRACT

A semiconductor package is provided. The semiconductor package includes: a lower equipotential plate provided in a lower wiring layer; an upper equipotential plate provided in an upper wiring layer; a pair of differential signal wiring lines provided in a signal wiring layer that is between the lower equipotential plate and the upper equipotential plate, wherein the pair of differential signal wiring lines includes a first differential signal wiring line and a second differential signal wiring line which are spaced apart from each other and extend in parallel; and a wiring insulating layer surrounding the pair of differential signal wiring lines, and filling between the signal wiring layer, the lower wiring layer, and the upper wiring layer. The wiring insulating layer includes a first wiring insulating layer surrounding the pair of differential signal wiring lines, and a second wiring insulating layer, and the first wiring insulating layer and the second wiring insulating layer include different materials.

20 Claims, 17 Drawing Sheets

(51) Int. Cl.
   *H01L 25/10* (2006.01)
   *H01L 23/00* (2006.01)
(52) U.S. Cl.
   CPC ............ *H01L 25/105* (2013.01); *H01L 24/16* (2013.01); *H01L 24/32* (2013.01); *H01L 24/73* (2013.01); *H01L 2224/16227* (2013.01); *H01L 2224/32225* (2013.01); *H01L 2224/73204* (2013.01)

(56) References Cited

U.S. PATENT DOCUMENTS

| | | |
|---|---|---|
| 9,627,126 B2 | 4/2017 | Moon et al. |
| 10,061,967 B2 | 8/2018 | Baek et al. |
| 10,943,878 B2 | 3/2021 | Lee et al. |
| 11,088,059 B2 | 8/2021 | Chen et al. |
| 2006/0180905 A1* | 8/2006 | Zeng ................ H01L 23/49822 257/E23.079 |
| 2015/0214142 A1* | 7/2015 | Kariyazaki ......... H01L 23/5225 257/773 |
| 2017/0098880 A1* | 4/2017 | Hidaka .................. H01F 38/14 |
| 2020/0137886 A1* | 4/2020 | Cheah .................. H05K 1/0245 |
| 2020/0395280 A1* | 12/2020 | Chen .................... H01L 23/145 |
| 2021/0125882 A1 | 4/2021 | Oh |
| 2022/0408555 A1* | 12/2022 | Tsubouchi ........... H05K 1/0298 |

FOREIGN PATENT DOCUMENTS

| | | |
|---|---|---|
| KR | 10-0850897 B1 | 8/2008 |
| KR | 10-2127827 B1 | 6/2020 |

\* cited by examiner

SEMICONDUCTOR PACKAGE AND PACKAGE-ON-PACKAGE HAVING DIFFERENT WIRING INSULATING LAYERS SURROUNDING DIFFERENTIAL SIGNAL WIRING LAYERS

CROSS-REFERENCE TO RELATED APPLICATION

This application claims priority under 35 U.S.C. § 119 to Korean Patent Application No. 10-2022-0039177, filed on Mar. 29, 2022, in the Korean Intellectual Property Office, the disclosure of which is incorporated by reference herein in its entirety.

BACKGROUND

The present disclosure relates to a semiconductor package and a package-on-package having the same, and more particularly, to a fan-out semiconductor package and a package-on-package having the same.

With the rapid development of the electronics industry and user demand, electronic apparatuses have become more compact and multi-functional, and increased in capacity, and accordingly, highly integrated semiconductor chips are demanded.

Accordingly, semiconductor packages having connection terminals securing connection reliability have been devised for highly integrated semiconductor chips having an increased number of connection terminals for input/output (I/O). For example, to prevent interference between connection terminals, fan-out semiconductor packages in which an interval between connection terminals is increased have been developed.

SUMMARY

The present disclosure provides a semiconductor package with improved signal integrity and a package-on-package having the same.

According to an aspect of an example embodiment, a semiconductor package includes: a lower equipotential plate provided in a lower wiring layer; an upper equipotential plate provided in an upper wiring layer; a pair of differential signal wiring lines provided in a signal wiring layer that is between the lower equipotential plate and the upper equipotential plate, wherein the pair of differential signal wiring lines includes a first differential signal wiring line and a second differential signal wiring line which are spaced apart from each other and extend in parallel; and a wiring insulating layer surrounding the pair of differential signal wiring lines, and filling between the signal wiring layer, the lower wiring layer, and the upper wiring layer. The wiring insulating layer includes a first wiring insulating layer surrounding the pair of differential signal wiring lines, and a second wiring insulating layer, and the first wiring insulating layer and the second wiring insulating layer include different materials.

According to an aspect of an example embodiment, a semiconductor package includes: a lower redistribution layer including a plurality of lower redistribution line patterns, a plurality of lower redistribution via patterns, a lower equipotential plate, and a lower redistribution insulating layer, wherein the lower redistribution layer includes a signal wiring layer and a lower wiring layer under the signal wiring layer, wherein a pair of differential signal wiring lines are provided in the plurality of lower redistribution line patterns in the signal wiring layer, wherein the lower equipotential plate is provided in the lower wiring layer, and wherein the pair of differential signal wiring lines includes a first differential signal wiring line and a second differential signal wiring line which are spaced apart from each other; an expanded layer overlapping portions of the pair of differential signal wiring lines along a vertical direction on the lower redistribution layer, the expanded layer including a substrate base having a mounting space, a plurality of wiring patterns and an upper equipotential plate on a surface of the substrate base, and a plurality of conductive vias passing through at least a portion of the substrate base, wherein the expanded layer has an upper wiring layer in which the upper equipotential plate is provided; and a semiconductor chip provided on the lower redistribution layer in the mounting space. The lower redistribution layer includes a first wiring insulating layer surrounding the pair of differential signal wiring lines, and a second wiring insulating layer. The pair of differential signal wiring lines and the second wiring insulating layer are spaced apart from each other. A first relative dielectric constant of the first wiring insulating layer is less than a second relative dielectric constant of the second wiring insulating layer.

According to an aspect of an example embodiment, a semiconductor package includes: a first semiconductor package including a lower redistribution layer, an expanded layer, a first semiconductor chip, and an upper redistribution layer, the lower redistribution layer including a surrounding equipotential plate which defines a differential signal opening, a signal wiring layer inside the differential signal opening, and a lower wiring layer in which a lower equipotential plate is provided, wherein a pair of differential signal wiring lines is provided in the signal wiring layer and includes a first differential signal wiring line and a second differential signal wiring line which extend apart from each other, wherein the lower redistribution layer includes a lower redistribution insulating layer, wherein the expanded layer overlaps portions of the pair of differential signal wiring lines along a vertical direction on the lower redistribution layer, wherein the expanded layer includes a substrate base having a mounting space, a plurality of wiring patterns and an upper equipotential plate on at least one of a top surface and a bottom surface of the substrate base, and a plurality of conductive vias passing through at least a portion of the substrate base, wherein the expanded layer has an upper wiring layer in which the upper equipotential plate is provided over the signal wiring layer, the first semiconductor chip inside the mounting space on the lower redistribution layer, and the upper redistribution layer on the expanded layer and the first semiconductor chip, wherein the upper redistribution layer includes a plurality of upper redistribution line patterns, a plurality of upper redistribution via patterns, and an upper redistribution insulating layer; and a second semiconductor package stacked on the first semiconductor package and including a second semiconductor chip electrically connected to the first semiconductor chip through the pair of differential signal wiring lines, and a package connection terminal attached to a package connection pad that is a portion of the plurality of upper redistribution via patterns, to electrically connect the second semiconductor chip to the first semiconductor package. The lower redistribution layer includes a first wiring insulating layer and a second wiring insulating layer which surround the pair of differential signal wiring lines. The pair of differential signal wiring lines and the second wiring insulating layer are spaced apart from each other. A first relative dielectric constant of the first wiring insulating layer is less than a second relative dielectric constant of the second wiring insulating layer.

BRIEF DESCRIPTION OF THE DRAWINGS

The above and other aspects and features will be more clearly understood from the following description, taken in conjunction with the accompanying drawings, in which.

DETAILED DESCRIPTION

Hereinafter, example embodiments are described in conjunction with the accompanying drawings. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
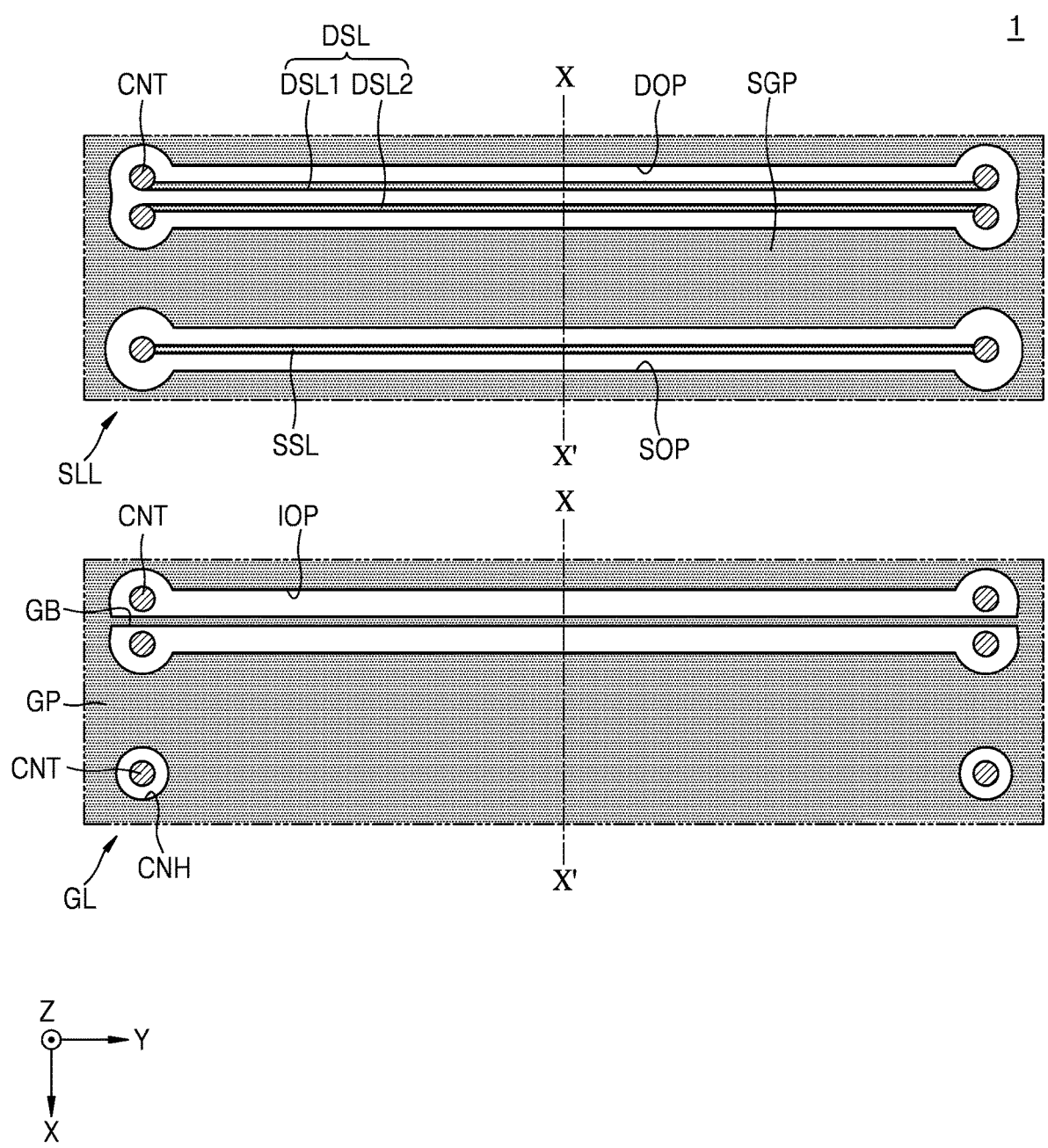
FIG. 1 illustrates plan views of line patterns of a semiconductor package, according to some example embodiments.

FIG. 1 illustrates line patterns of a semiconductor package 1, according to some example embodiments. In detail, FIG. 1 illustrates different wiring layers.

Referring to FIG. 1, the semiconductor package 1 may include a signal wiring line layer SLL and a wiring layer GL. The signal wiring line layer SLL may be a signal wiring line layer SLL of semiconductor packages 1a, 1b, 1c, 1d, 1e, 1f, 1g, and 1h of FIGS. 2A, 2B, 2C, 2D, 3A, 2B, 3C and 3D, and the wiring layer GL may correspond to upper wiring layers UGL and UGLa or lower wiring layers LGL and LGLa.

In the present disclosure, a signal wiring line layer and a wiring layer indicate where a circuit wiring forming an electrical path on the same plane is disposed. In more detail, a signal wiring line layer indicates where a signal wiring line is mainly disposed, and a wiring layer indicates where an equipotential plate is mainly disposed. The equipotential plate may be a power plate for providing power, or a ground plate for providing ground. For example, only a signal wiring line may be disposed in the signal wiring line layer, or an equipotential plate and signal wiring lines may be disposed in the signal wiring line layer. For example, only an equipotential plate may be disposed in the wiring layer, or signal wiring lines and an equipotential plate may be disposed in the wiring layer. The wiring layer that includes both the equipotential plate and the signal wiring lines may include fewer signal wiring lines than the signal wiring line layer that includes both the equipotential plate and the signal wiring lines.

The signal wiring line layer SLL and the wiring layer GL are wiring layers at different vertical levels of the semiconductor package 1. The signal wiring line layer SLL and the wiring layer GL in FIG. 1 may overlap each other in the vertical direction (Z direction).

A pair of differential signal wiring lines DSL and a single signal wiring line SSL may be disposed in the signal wiring line layer SLL. The pair of differential signal wiring lines DSL, through which signals having opposite phases flow, may include a first differential signal wiring line DSL1 and a second differential signal wiring line DSL2, which extend in a horizontal direction (X direction and/or Y direction) apart from each other and parallel to each other. The single signal wiring line SSL may be spaced apart from the pair of differential signal wiring lines DSL in the horizontal direction (X direction and/or Y direction) and may extend in the horizontal direction (X direction and/or Y direction). Although FIG. 1 illustrates that the first differential signal wiring line DSL1, the second differential signal wiring line DSL2, and the single signal wiring line SSL each extend in one horizontal direction (X direction and/or Y direction), this is an example, and the disclosure is not limited thereto. The first differential signal wiring line DSL1, the second differential signal wiring line DSL2, and the single signal wiring line SSL may each extend, or refract and extend, in various directions crossing the vertical direction (Z direction), within the signal wiring line layer SLL disposed on the same plane.

In some example embodiments, a surrounding equipotential plate SGP apart from each of the differential signal wiring lines DSL and the single signal wiring line SSL and surrounding the pair of differential signal wiring lines DSL and the single signal wiring line SSL may be disposed in the signal wiring line layer SLL. The surrounding equipotential plate SGP may define a differential signal opening DOP and a single signal opening SOP. A surrounding equipotential plate indicates an equipotential plate surrounding a signal wiring line. The pair of differential signal wiring lines DSL may be disposed in the differential signal opening DOP, and the single signal wiring line SSL may be disposed in the single signal opening SOP. Although FIG. 1 illustrates that one single signal wiring line SSL is disposed in the single signal opening SOP, this is an example, and the disclosure is not limited thereto. For example, a plurality of single signal wiring lines SSL apart from each other in the horizontal direction (X direction and/or Y direction) may be disposed in the single signal opening SOP.

An equipotential plate GP may be disposed in the wiring layer GL. The equipotential plate GP may define an impedance opening IOP corresponding to the differential signal opening DOP. The impedance opening IOP and the differential signal opening DOP may at least partially overlap each other in the vertical direction. The impedance opening IOP may at least partially overlap, in the vertical direction, each of the first differential signal wiring line DSL1 and the second differential signal wiring line DSL2 of the pair of differential signal wiring lines DSL. For example, each of the first differential signal wiring line DSL1 and the second differential signal wiring line DSL2 may extend in the vertical direction (Z direction) between both ends thereof connected to a contact plug CNT, by at least partially overlapping the impedance opening IOP.

The equipotential plate GP may define a contact opening CNH through which the contact plug CNT connected to both ends of the single signal wiring line SSL passes. Portions of the single signal wiring line SSL, from which parts of both ends thereof connected to the contact plug CNT are removed, may overlap the equipotential plate GP in the vertical direction (Z direction).

The contact plug CNT connected to each of both ends of the single signal wiring line SSL may be referred to as a single signal contact plug, and the contact plugs CNT connected to both ends of each of the first differential signal wiring line DSL1 and the second differential signal wiring line DSL2 of the pair of differential signal wiring lines DSL may be referred to as differential signal contact plugs.

In some example embodiments, the semiconductor package 1 may include the wiring layer GL at each position above and below the signal wiring line layer SLL. The wiring layer GL above the signal wiring line layer SLL may be referred to as an upper wiring layer, and the wiring layer GL below the signal wiring line layer SLL may be referred to as a lower wiring layer.

The signal wiring line layer SLL and the wiring layer GL may each be a wiring layer of a printed circuit board, or a wiring layer of a redistribution layer. In some example embodiments, each of the signal wiring line layer SLL, the upper wiring layer, and the lower wiring layer may be a wiring layer of a printed circuit board. In some example embodiments, each of the signal wiring line layer SLL, the upper wiring layer, and the lower wiring layer may be a wiring layer of a redistribution layer. In some example embodiments, some of the signal wiring line layer SLL, the upper wiring layer, and the lower wiring layer may be wiring layers of a printed circuit board, and some others may be wiring layers of a redistribution layer.

The first differential signal wiring line DSL1, the second differential signal wiring line DSL2, the single signal wiring line SSL, the surrounding equipotential plate SGP, the equipotential plate GP, and the contact plug CNT may each include metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), and the like, an alloy thereof, stainless steel, or beryllium copper, but the disclosure is not limited thereto.

FIGS. 2A, 2B, 2C and 2D illustrate plan views of line patterns included in semiconductor packages according to some example embodiments. In detail, FIGS. 2A, 2B, 2C and 2D are cross-sectional views of a portion corresponding to line X-X' of FIG. 1. In FIGS. 2A, 2B, 2C and 2D, the same reference names as those of FIG. 1 denote substantially the same elements or modified elements, like reference numerals denote substantially the same elements, and any description redundant to the description of FIG. 1 may be omitted.

Figure 2A:
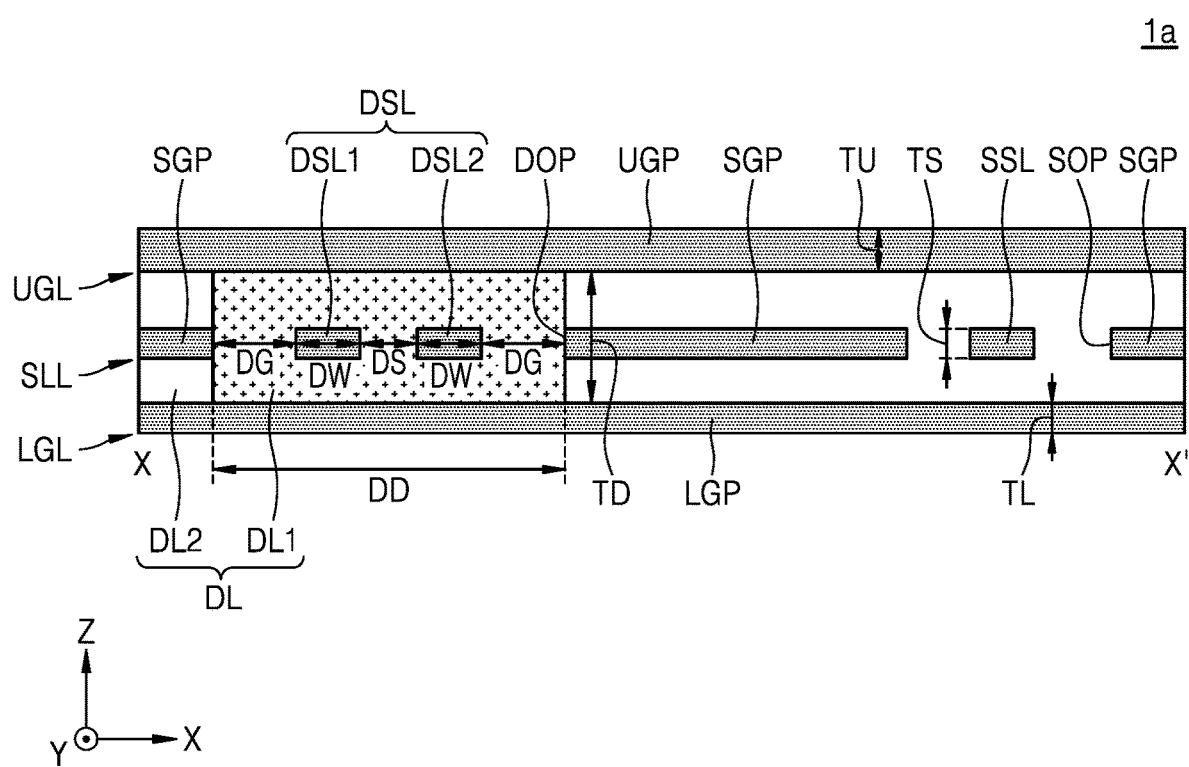
FIGS. 2A, 2B, 2C and 2D illustrate plan views of line patterns included in semiconductor packages according to some example embodiments.

Referring to FIG. 2A, a semiconductor package 1a may include the signal wiring line layer SLL, and an upper wiring layer UGL and a lower wiring layer LGL respectively disposed above and below the signal wiring line layer SLL. The pair of differential signal wiring lines DSL, the single signal wiring line SSL, and a signal ground plate SGP may be disposed in the signal wiring line layer SLL. An upper equipotential plate UGP may be disposed in the upper wiring layer UGL, and a lower equipotential plate LGP may be disposed in the lower wiring layer LGL.

The surrounding equipotential plate SGP may define the differential signal opening DOP and the single signal opening SOP. The pair of differential signal wiring lines DSL may be disposed in the differential signal opening DOP, and the single signal wiring line SSL may be disposed in the single signal opening SOP. The pair of differential signal wiring lines DSL, through which signals having the opposite phases flow, may include the first differential signal wiring line DSL1 and the second differential signal wiring line DSL2, which are apart from each other and extending parallel to each other in the horizontal direction (X direction and/or Y direction). The single signal wiring line SSL may be spaced apart from the pair of differential signal wiring lines DSL and may extend in the horizontal direction (X direction and/or Y direction).

Each of the first differential signal wiring line DSL1 and the second differential signal wiring line DSL2 may have a first horizontal width DW. For example, the first horizontal width DW may be about 5 μm to about 20 μm.

The first differential signal wiring line DSL1, the second differential signal wiring line DSL2, the single signal wiring line SSL, and the surrounding equipotential plate SGP may each have a first thickness TS that is substantially the same thickness. The upper equipotential plate UGP may have a second thickness TU that is substantially the same thickness. The lower equipotential plate LGP may have a third thickness TL that is substantially the same thickness. In some example embodiments, the second thickness TU may have a value greater than each of the first thickness TS and the third thickness TL. In some example embodiments, the first thickness TS and the third thickness TL may have substantially the same value. In some example embodiments, the second thickness TU may be about 10 μm or more, and the first thickness TS and the third thickness TL may be less than about 10 μm. For example, the first thickness TS and the third thickness TL may be about 2 μm to about 9 μm, and the second thickness TU may be about 10 μm to about 30 μm.

The first differential signal wiring line DSL1 and the second differential signal wiring line DSL2 of the pair of differential signal wiring lines DSL may extend parallel to each other while maintaining substantially the same first separation distance DS. For example, the first separation distance DS may be about 5 μm to about 15 μm.

The pair of differential signal wiring lines DSL may be spaced apart from the surrounding equipotential plate SGP by a second separation distance DG. For example, the second separation distance DG may be about 10 μM to about 30 μm.

The semiconductor package 1a may further include a wiring insulating layer DL. The wiring insulating layer DL may surround the pair of differential signal wiring lines DSL by filling the differential signal opening DOP, and may fill between the upper wiring layer UGL, the signal wiring line layer SLL, and the lower wiring layer LGL. The wiring insulating layer DL may include a first wiring insulating layer DL1 surrounding the pair of differential signal wiring lines DSL, and a second wiring insulating layer DL2. For example, the pair of differential signal wiring lines DSL may directly contact the first wiring insulating layer DL1, and the single signal wiring line SSL may directly contact the second wiring insulating layer DL2.

The first wiring insulating layer DL1 may surround the pair of differential signal wiring lines DSL. The second wiring insulating layer DL2 may be spaced apart from the pair of differential signal wiring lines DSL with the first wiring insulating layer DL1 therebetween. For example, the pair of differential signal wiring lines DSL may not be in contact with the second wiring insulating layer DL2. For example, the pair of differential signal wiring lines DSL may be spaced apart from the second wiring insulating layer DL2.

The first wiring insulating layer DL1 and the second wiring insulating layer DL2 may include materials different from each other. For example, the first wiring insulating layer DL1 and the second wiring insulating layer DL2 may have different constituent materials or different composition ratios of constituent materials. For example, the relative dielectric constant of the first wiring insulating layer DL1 may be less than the relative dielectric constant of the second wiring insulating layer DL2. For example, the relative dielectric constant of the first wiring insulating layer DL1 may be in a range of about 0.5 to about 2.5, and the relative dielectric constant of the second wiring insulating layer DL2 may be in a range of about 2.5 to about 5.0.

For example, the upper surface of the first wiring insulating layer DL1 may be in contact with the lower surface of the upper wiring layer UGL, and the lower surface of the first wiring insulating layer DL1 may be in contact with the upper surface of the lower wiring layer LGL. Furthermore, the side surface of the first wiring insulating layer DL1 may be in contact with the side surface of the differential signal opening DOP.

A horizontal width DD of the first wiring insulating layer DL1 may be greater than a sum of the first separation distance DS, twice the first horizontal width DW, and twice the second separation distance DG. For example, a thickness TD of the first wiring insulating layer DL1 may be about 7 μm to about 50 μm, and the horizontal width DD of the first wiring insulating layer DL1 may be about 35 μm to about 115 μm. For example, the thickness TD of the first wiring insulating layer DL1 may be greater than the first thickness TS. Furthermore, the horizontal width DD of the first wiring insulating layer DL1 may be greater than the horizontal width of the pair of differential signal wiring lines DSL.

The wiring insulating layer DL may be formed of a material film including, for example, an organic compound. In some example embodiments, the wiring insulating layer DL may be formed of a material film including an organic polymer material. For example, the wiring insulating layer DL may include a photo imagable dielectric (PID), an Ajinomoto build-up film (ABF), or photosensitive polyimide (PSPI). In some example embodiments, the wiring insulating layer DL may include at least one material selected from phenol resin, epoxy resin, and polyimide. The wiring insulating layer DL may include at least one material selected from, for example, Frame Retardant 4 (FR-4), tetrafunctional epoxy, polyphenylene ether, epoxy/polyphenylene oxide, bismaleimide triazine (BT), thermount, cyanate ester, polyimide, and liquid crystal polymer.

The wiring insulating layer DL may include a portion surrounding the pair of differential signal wiring lines DSL by filling the differential signal opening DOP, a portion filling between the upper wiring layer UGL and the signal wiring line layer SLL, and a portion filling between the signal wiring line layer SLL and the lower wiring layer LGL, in which one portion and the other portion include different materials. For example, while the first wiring insulating layer DL1 may be a portion of a redistribution layer formed of a material film including an organic polymer material, the second wiring insulating layer DL2 may be a portion of a printed circuit board including at least one material selected from phenol resin, epoxy resin, and polyimide.

Accordingly, the pair of differential signal wiring lines DSL disposed between the upper equipotential plate UGP and the lower equipotential plate LGP may control impedance by using the first wiring insulating layer DL1 and the second wiring insulating layer DL2. When the dielectric constants of the wiring layers are different, the capacitance of each wiring layer may be different. Accordingly, the target impedance of the pair of differential signal wiring lines DSL can be adjusted by adjusting the dielectric constants of the first wiring insulating layer DL1 and the second wiring insulating layer DL2, respectively. Accordingly, as the target impedance of the pair of differential signal wiring lines DSL may be satisfied, the signal integrity of the semiconductor package 1a may be improved.

Figure 2B:
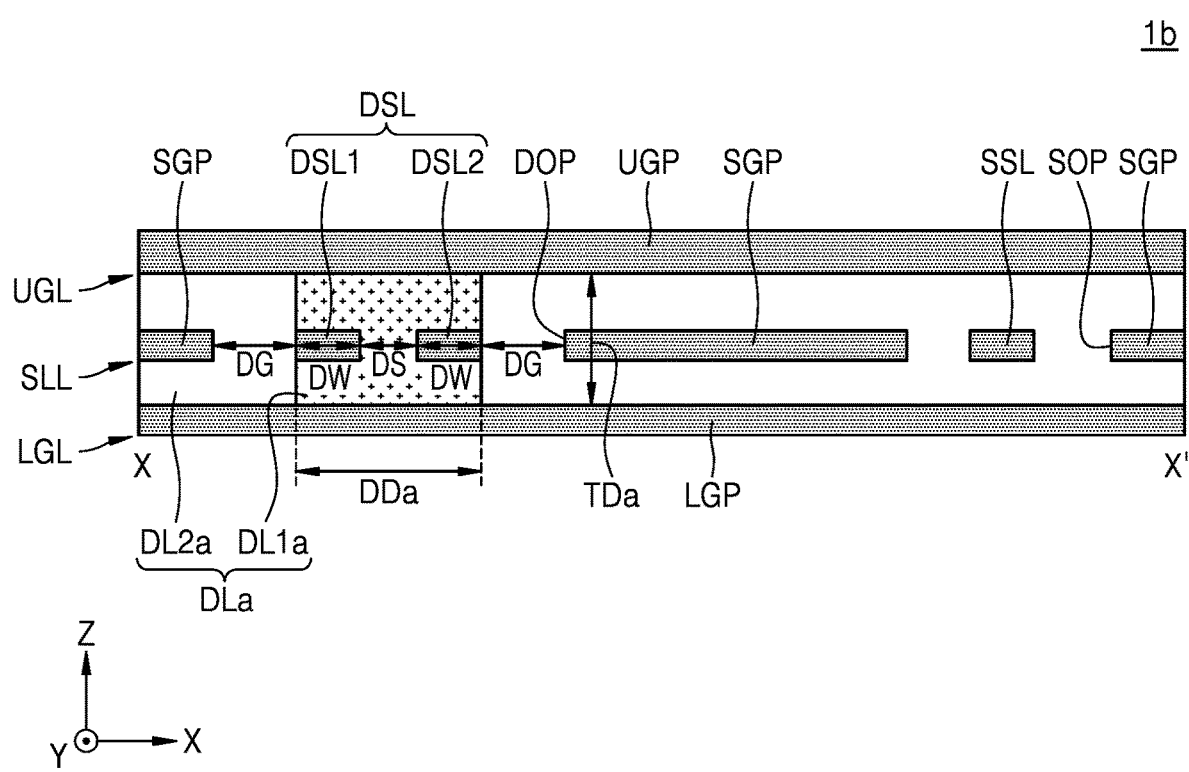

Referring to FIG. 2B, a semiconductor package 1b may include the signal wiring line layer SLL, the upper wiring layer UGL and the lower wiring layer LGL respectively disposed above and below the signal wiring line layer SLL, a first wiring insulating layer DL1a, and a second wiring insulating layer DL2a.

The upper surface of the first wiring insulating layer DL1a may be in contact with the lower surface of the upper wiring layer UGL, and the lower surface of the first wiring insulating layer DL1a may be in contact with the upper surface of the lower wiring layer LGL. Furthermore, the side surface of the first wiring insulating layer DL1a may be in contact with the side surfaces of the pair of differential signal wiring lines DSL.

For example, a horizontal width DDa of the first wiring insulating layer DL1a may be greater than the sum of the first separation distance DS and twice the first horizontal width DW. For example, a thickness TDa of the first wiring insulating layer DL1a may be about 7 μm to about 50 μm, and the horizontal width DDa of the first wiring insulating layer DL1a may be about 15 μM to about 55 μm.

Accordingly, the pair of differential signal wiring lines DSL disposed between the upper equipotential plate UGP and the lower equipotential plate LGP may control impedance by using the first wiring insulating layer DL1a and the second wiring insulating layer DL2a. When the dielectric constants of the wiring layers are different, the capacitance of each wiring layer may be different. Accordingly, the target impedance of the pair of differential signal wiring lines DSL can be adjusted by adjusting the dielectric constants of the first wiring insulating layer DL1a and the second wiring insulating layer DL2a, respectively. Accordingly, as the target impedance of the pair of differential signal wiring lines DSL may be satisfied, the signal integrity of the semiconductor package 1b may be improved.

Figure 2C:
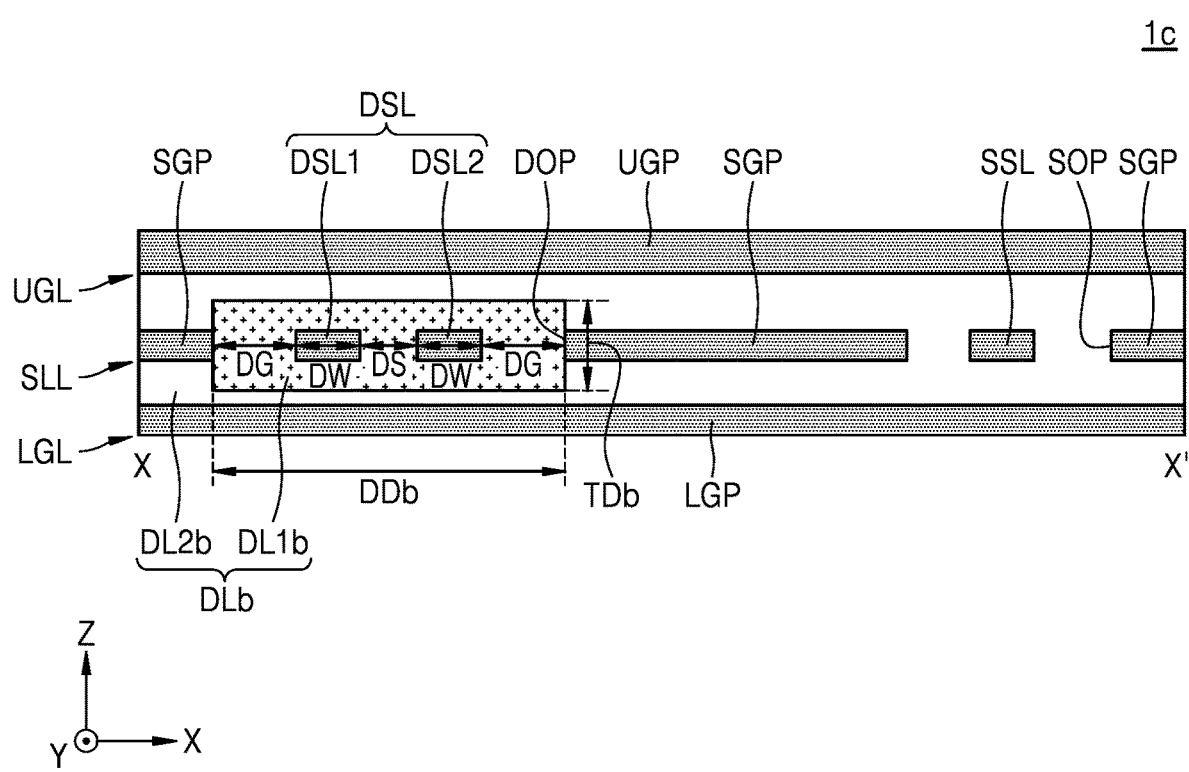

Referring to FIG. 2C, a semiconductor package 1c may include the signal wiring line layer SLL, the upper wiring layer UGL and the lower wiring layer LGL respectively disposed above and below the signal wiring line layer SLL, a first wiring insulating layer DL1b, and a second wiring insulating layer DL2b.

A vertical level of the upper surface of the first wiring insulating layer DL1b may be between a vertical level of the lower surface of the upper wiring layer UGL and a vertical level of the upper surface of the differential signal opening DOP, and a vertical level of the lower surface of the first wiring insulating layer DL1b may be between a vertical level of the upper surface of the lower wiring layer LGL and the vertical level of the lower surface of the differential signal opening DOP. Furthermore, the side surface of the first wiring insulating layer DL1b may be in contact with the side surface of the differential signal opening DOP.

For example, a horizontal width DDb of the first wiring insulating layer DL1b may be greater than the sum of the first separation distance DS, twice the first horizontal width DW, and twice the second separation distance DG. For example, a thickness TDb of the first wiring insulating layer DL1b may be about 3 μm to about 30 μm, and the horizontal width DDb of the first wiring insulating layer DL1b may be about 35 μm to about 115 μm.

Accordingly, the pair of differential signal wiring lines DSL disposed between the upper equipotential plate UGP and the lower equipotential plate LGP may control impedance by using the first wiring insulating layer DL1b and the second wiring insulating layer DL2b. When the dielectric constants of the wiring layers are different, the capacitance of each wiring layer may be different. Accordingly, the target impedance of the pair of differential signal wiring lines DSL can be adjusted by adjusting the dielectric constants of the first wiring insulating layer DL1b and the second wiring insulating layer DL2b, respectively. Accordingly, as the target impedance of the pair of differential signal wiring lines DSL may be satisfied, the signal integrity of the semiconductor package 1c may be improved.

Figure 2D:
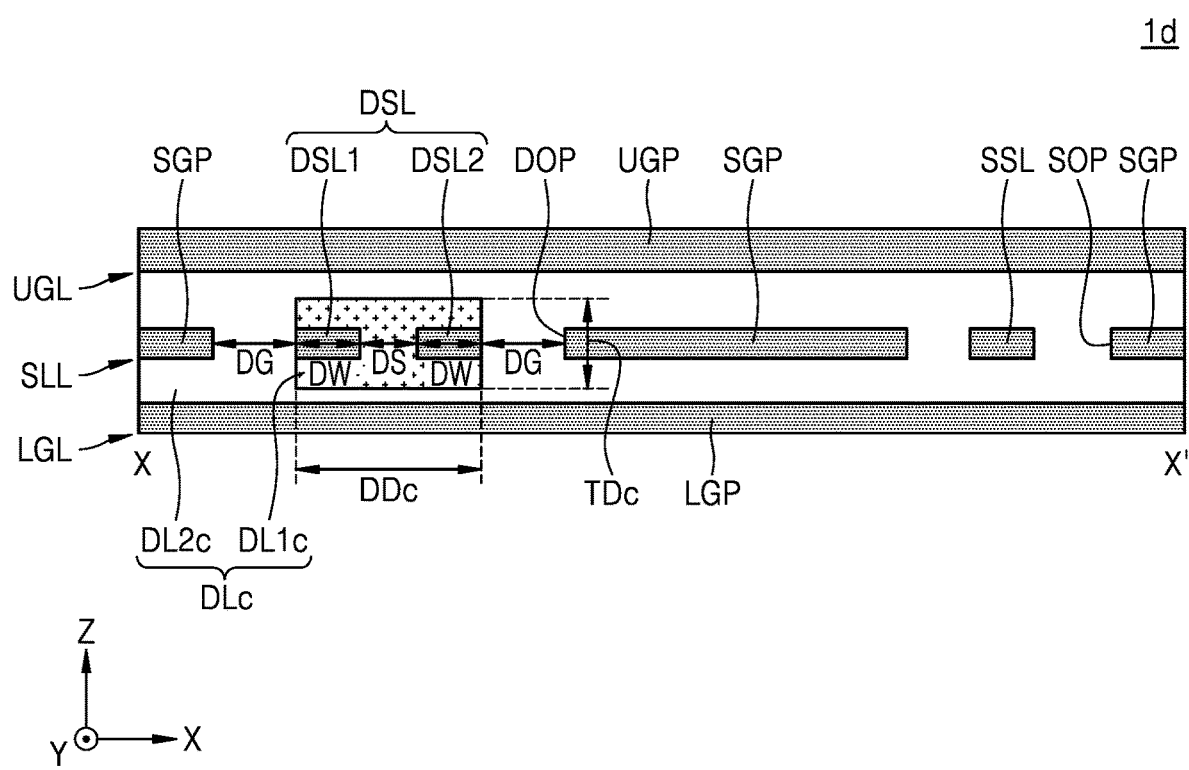

Referring to FIG. 2D, a semiconductor package 1d may include the signal wiring line layer SLL, the upper wiring layer UGL and the lower wiring layer LGL respectively disposed above and below the signal wiring line layer SLL, a first wiring insulating layer DL1c, and a second wiring insulating layer DL2c.

A vertical level of the upper surface of the first wiring insulating layer DL1c may be between the vertical level of the lower surface of the upper wiring layer UGL and the vertical level of the upper surface of the differential signal opening DOP, and a vertical level of the lower surface of the first wiring insulating layer DL1c may be between the vertical level of the upper surface of the lower wiring layer LGL and the vertical level of the lower surface of the differential signal opening DOP. Furthermore, the side surface of the first wiring insulating layer DL1c may be disposed between the side surface of the differential signal opening DOP and the side surfaces of the pair of differential signal wiring lines DSL.

For example, a horizontal width DDc of the first wiring insulating layer DL1c may be greater than the sum of the first separation distance DS and twice the first horizontal width DW. For example, a thickness TDc of the first wiring insulating layer DL1c may be about 3 μm to about 30 μm, and the horizontal width DDc of the first wiring insulating layer DL1c may be about 15 μm to about 70 μm. In another example, the thickness TDc of the first wiring insulating layer DL1c may be about 3 μm to about 100 μm, and the horizontal width DDc of the first wiring insulating layer DL1c may be about 15 μm to about 500 μm.

Accordingly, the pair of differential signal wiring lines DSL disposed between the upper equipotential plate UGP and the lower equipotential plate LGP may control impedance by using the first wiring insulating layer DL1c and the second wiring insulating layer DL2c. When the dielectric constants of the wiring layers are different, the capacitance of each wiring layer may be different. Accordingly, the target impedance of the pair of differential signal wiring lines DSL can be adjusted by adjusting the dielectric constants of the first wiring insulating layer DL1c and the second wiring insulating layer DL2c, respectively. Accordingly, as the target impedance of the pair of differential signal wiring lines DSL may be satisfied, the signal integrity of the semiconductor package 1d may be improved.

FIGS. 3A, 3B, 3C and 3D illustrate plan views of line patterns included in semiconductor packages according to some example embodiments. In detail, FIGS. 3A, 3B, 3C and 3D are cross-sectional views taken along line X-X' FIG. 1. In FIGS. 3A, 3B, 3C and 3D, the same reference names as those of FIG. 1 denote substantially the same elements or modified elements, like reference numerals denote substantially the same elements, and any description redundant to the description of FIG. 1 may be omitted Referring to FIG. 3A, a semiconductor package 1e may have the signal wiring line layer SLL, and an upper wiring layer UGLa and a lower wiring layer LGLa respectively disposed above and below the signal wiring line layer SLL. The pair of differential signal wiring lines DSL, the single signal wiring line SSL, and the signal ground plate SGP may be disposed in the signal wiring line layer SLL. An upper equipotential plate UGP and an upper equipotential bridge UGB may be disposed in the upper wiring layer UGLa, and a lower equipotential plate LGPa and a lower equipotential bridge LGB may be disposed in the lower wiring layer LGLa.

The upper equipotential plate UGPa and the lower equipotential plate LGPa may respectively define an upper impedance opening UIOP and a lower impedance opening LIOP both corresponding to the differential signal opening DOP. Each of the upper impedance opening UIOP and the lower impedance opening LIOP may at least partially overlap the differential signal opening DOP in the vertical direction. In some example embodiments, the differential signal opening DOP may overlap both of the upper impedance opening UIOP and the lower impedance opening LIOP, therein, in the vertical direction. Each of the first differential signal wiring line DSL1 and the second differential signal wiring line DSL2 of the pair of differential signal wiring lines DSL may overlap both of the upper impedance opening UIOP and the lower impedance opening LIOP, therein, in the vertical direction.

The upper equipotential bridge UGB may extend to bisect the upper impedance opening UIOP and may be disposed in the upper wiring layer UGLa, and the lower equipotential bridge LGB may extend to bisect the lower impedance opening LIOP and may be disposed in the lower wiring layer LGLa. Each of the upper equipotential bridge UGB and the lower equipotential bridge LGB may overlap a space between the first differential signal wiring line DSL1 and the second differential signal wiring line DSL2 of the pair of differential signal wiring lines DSL, in the vertical direction.

The planar shapes of the upper impedance opening UIOP and the upper equipotential bridge UGB may be substantially the same as the planar shapes of the lower impedance opening LIOP and the lower equipotential bridge LGB. For example, the upper impedance opening UIOP and the lower impedance opening LIOP may overlap each other in the vertical direction, and the upper equipotential bridge UGB and the lower equipotential bridge LGB may overlap each other in the vertical direction.

The first differential signal wiring line DSL1, the second differential signal wiring line DSL2, the single signal wiring line SSL, and the surrounding equipotential plate SGP may each have the first thickness TS that is substantially the same thickness. The upper equipotential bridge UGB and the upper equipotential plate UGPa may each have the second thickness TU that is substantially the same thickness. The lower equipotential bridge LGB and the lower equipotential plate LGPa may each have the third thickness TL that is substantially the same thickness.

The first differential signal wiring line DSL1 and the second differential signal wiring line DSL2 of the pair of differential signal wiring lines DSL may extend parallel to each other while maintaining the first separation distance DS that is substantially the same distance. For example, the first separation distance DS may be about 5 µm to about 15 µm. In some example embodiments, the first separation distance DS may have substantially the same value as a second horizontal width GW. For example, each of the upper equipotential bridge UGB and the lower equipotential bridge LGB may overlap the space between the first differential signal wiring line DSL1 and the second differential signal wiring line DSL2 of the pair of differential signal wiring lines DSL, in the vertical direction.

The pair of differential signal wiring lines DSL may be spaced apart from the surrounding equipotential plate SGP by the second separation distance DG. For example, the second separation distance DG may be about 10 µm to about 30 µm. The upper equipotential bridge UGB and the lower equipotential bridge LGB may be respectively apart from the upper equipotential plate UGPa and the lower equipotential plate LGPa, by a third separation distance GG. For example, the third separation distance GG may be about 30 µm to about 200 µm. In some example embodiments, the third separation distance GG may have a value greater than the sum of the first horizontal width DW and the second separation distance DG.

In some example embodiments, the horizontal width of the differential signal opening DOP with respect to a direction perpendicular to the extension direction of the pair of differential signal wiring lines DSL may have a value less than each of the horizontal width of the upper impedance opening UIOP with respect to the extension direction of the upper equipotential bridge UGB and the horizontal width of the lower impedance opening LIOP with respect to the extension direction of the lower equipotential bridge LGB. The horizontal width of the differential signal opening DOP with respect to the direction perpendicular to the extension direction of the pair of differential signal wiring lines DSL may be the sum of twice the first horizontal width DW, the first separation distance DS, and twice the second separation distance DG. Each of the horizontal width of the upper impedance opening UIOP with respect to the extension direction of the upper equipotential bridge UGB and the horizontal width of the lower impedance opening LIOP with respect to the extension direction of the lower equipotential bridge LGB may be the sum of the second horizontal width GW and twice the third separation distance GG. For example, the differential signal opening DOP may overlap the upper impedance opening UIOP and the lower impedance opening LIOP, therein, in the vertical direction.

The semiconductor package 1e may further include a wiring insulating layer DLd. The wiring insulating layer DLd may surround the pair of differential signal wiring lines DSL by filling the differential signal opening DOP, surround the upper equipotential bridge UGB and the lower equipotential bridge LGB by filling the upper impedance opening UIOP and the lower impedance opening LIOP, and fill between the upper wiring layer UGLa, the signal wiring line layer SLL, and the lower wiring layer LGLa.

The wiring insulating layer DLd may include a portion surrounding the pair of differential signal wiring lines DSL by filling the differential signal opening DOP, a portion surrounding the upper equipotential bridge UGB by filling the upper impedance opening UIOP, a portion surrounding the lower equipotential bridge LGB by filling the lower impedance opening LIOP, a portion filling between the upper wiring layer UGLa and the signal wiring line layer SLL, and a portion filling between the signal wiring line layer SLL and the lower wiring layer LGLa, in which one portion and the other portion include different materials.

Figure 3A:
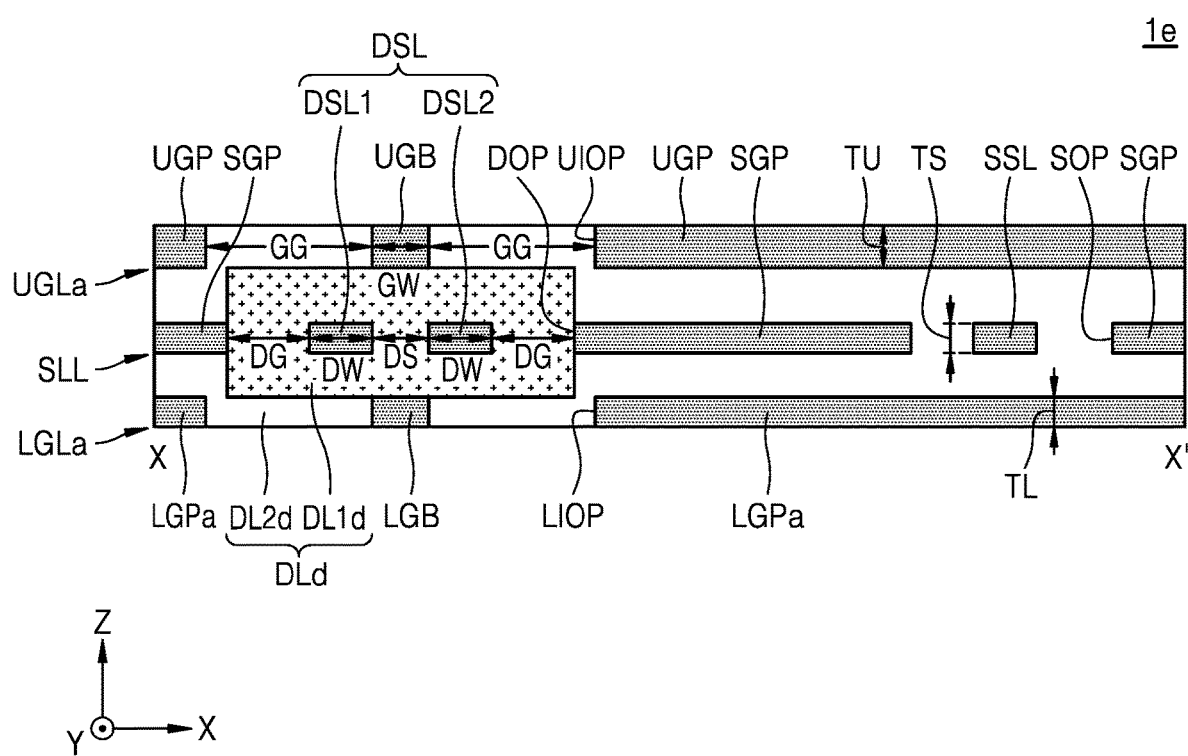
FIGS. 3A, 3B, 3C and 3D illustrate plan views of line patterns included in semiconductor packages according to some example embodiments.

Although FIG. 3A illustrates that the upper surface of a first wiring insulating layer DL1$d$ is at the same vertical level as the lower surface of the upper wiring layer UGL, the lower surface of the first wiring insulating layer DL1$d$ is at the same vertical level of the upper surface of the lower wiring layer LGL, and the side surface of the first wiring insulating layer DL1$d$ is in contact with the side surface of the differential signal opening DOP, this is an example and the shape of the first wiring insulating layer DL1$d$ is not limited thereto. For example, the first wiring insulating layer DL1$d$ may be the first wiring insulating layers DL1$a$, DL1$b$, and/or DL1$c$ of FIGS. 2B to 2D. For example, the first wiring insulating layer DL1$d$ may fill at least part of the upper impedance opening UIOP and/or at least part of the lower impedance opening LIOP.

In the semiconductor package 1e, the upper equipotential plate UGPa and the lower equipotential plate LGPa may define the upper impedance opening UIOP and the lower impedance opening LIOP, respectively, and the upper impedance opening UIOP and the lower impedance opening LIOP may be respectively disposed above and below the pair of differential signal wiring lines DSL. Accordingly, the pair of differential signal wiring lines DSL disposed between the upper equipotential plate UGPa and the lower equipotential plate LGPa may control impedance by using the upper impedance opening UIOP and the lower impedance opening LIOP. When openings are placed above and/or below the signal wiring, the length of the signal path increases, which can increase inductance of the signal wiring. Accordingly, the target impedance of the pair of differential signal wiring lines DSL can be adjusted by arranging openings above and/or below the pair of differential signal wiring lines DSL. Accordingly, as the target impedance of the pair of differential signal wiring lines DSL may be satisfied, the signal integrity of the semiconductor package 1e may be improved.

Furthermore, the pair of differential signal wiring lines DSL disposed between the upper equipotential plate UGP and the lower equipotential plate LGP may control impedance by using the first wiring insulating layer DL1$d$ and a second wiring insulating layer DL2$d$. When the dielectric constants of the wiring layers are different, the capacitance of each wiring layer may be different. Accordingly, the target impedance of the pair of differential signal wiring lines DSL can be adjusted by adjusting the dielectric constants of the first wiring insulating layer DL1$d$ and the second wiring insulating layer DL2$d$, respectively. Accordingly, as the target impedance of the pair of differential signal wiring lines DSL may be satisfied, the signal integrity of the semiconductor package 1e may be improved.

Figure 3B:
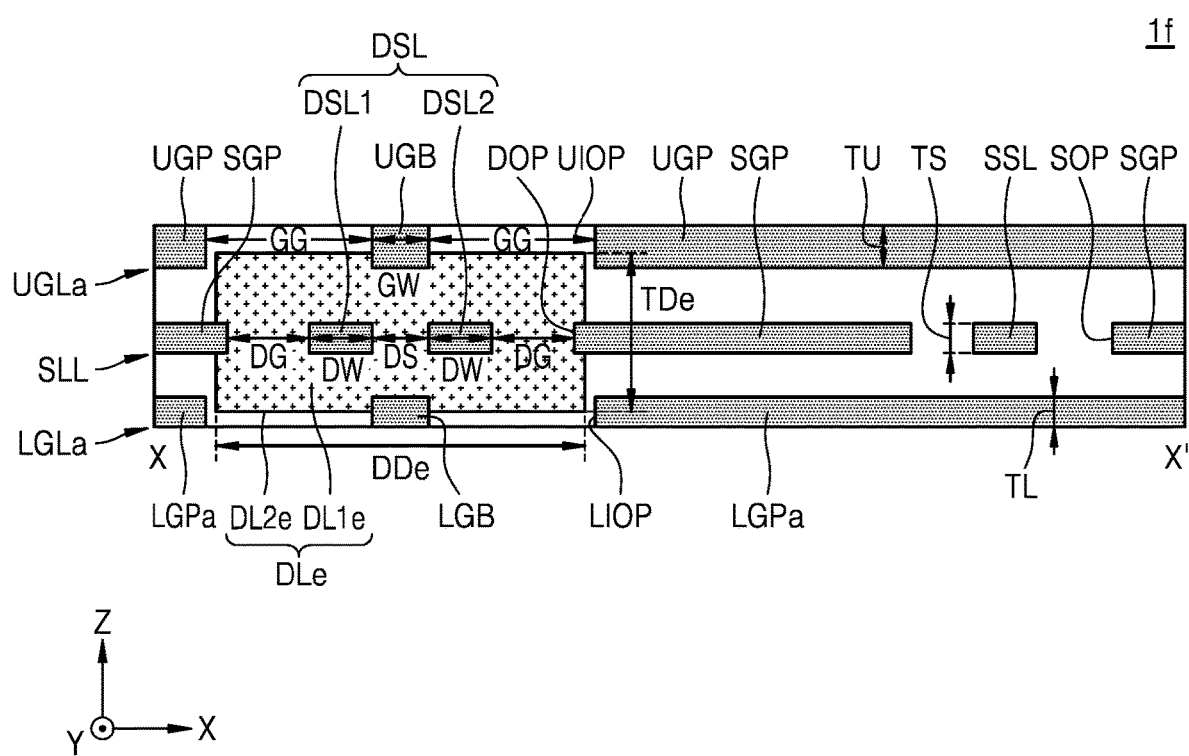

Referring to FIG. 3B, a semiconductor package 1f may include the signal wiring line layer SLL, the upper wiring layer UGL and the lower wiring layer LGL respectively disposed above and below the signal wiring line layer SLL, a first wiring insulating layer DL1$e$, and a second wiring insulating layer DL2$e$.

The first wiring insulating layer DL1$e$ may fill at least part of the upper impedance opening UIOP and/or at least part of the lower impedance opening LIOP. For example, the upper surface of the first wiring insulating layer DL1$e$ may be at a vertical level higher than the lower surface of the upper impedance opening UIOP and/or the lower surface of the first wiring insulating layer DL1e may be at a vertical level lower than the upper surface of the lower impedance opening LIOP.

A horizontal width DDd of the first wiring insulating layer DL1e may be greater than the sum of the first separation distance DS, twice the first horizontal width DW, and twice the second separation distance DG. For example, a thickness TDd of the first wiring insulating layer DL1e may be about 7 μm to about 100 μm, and the horizontal width DDd of the first wiring insulating layer DL1e may be about 35 μm to about 500 μm.

Accordingly, the pair of differential signal wiring lines DSL disposed between the upper equipotential plate UGPa and the lower equipotential plate LGPa may control impedance by using the first wiring insulating layer DL1e and the second wiring insulating layer DL2e. When the dielectric constants of the wiring layers are different, the capacitance of each wiring layer may be different. Accordingly, the target impedance of the pair of differential signal wiring lines DSL can be adjusted by adjusting the dielectric constants of the first wiring insulating layer DL1e and the second wiring insulating layer DL2e, respectively. Accordingly, as the target impedance of the pair of differential signal wiring lines DSL may be satisfied, the signal integrity of the semiconductor package if may be improved.

Figure 3C:
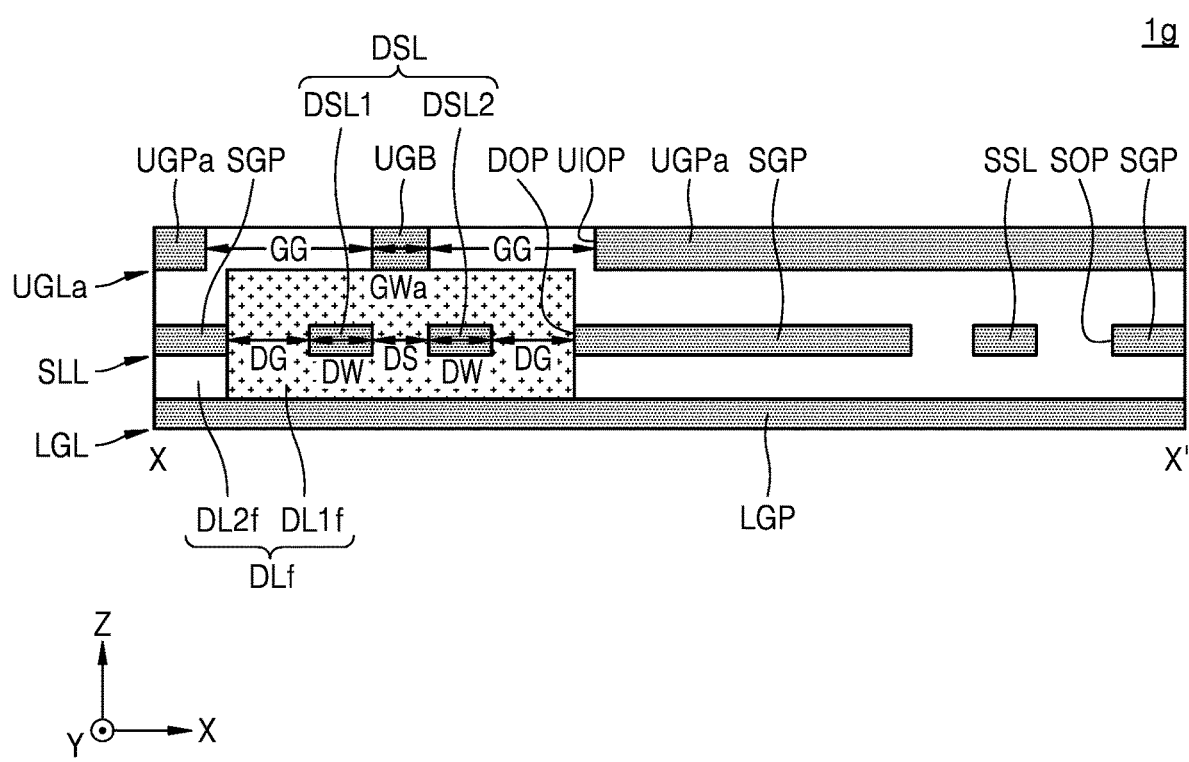

Referring to FIG. 3C, a semiconductor package 1g may include the signal wiring line layer SLL, and the upper wiring layer UGLa and the lower wiring layer LGL respectively disposed above and below the signal wiring line layer SLL. The pair of differential signal wiring lines DSL, the single signal wiring line SSL, and the signal ground plate SGP may be disposed in the signal wiring line layer SLL. The upper equipotential plate UGPa and the upper equipotential bridge UGB may be disposed in the upper wiring layer UGLa, and the lower equipotential plate LGP may be disposed in the lower wiring layer LGL.

The semiconductor package 1g may include the lower equipotential plate LGP of the lower wiring layer LGL, instead of the lower equipotential plate LGPa and the lower equipotential bridge LGB of the lower wiring layer LGLa of the semiconductor package 1e of FIG. 3A. The lower equipotential plate LGP may not define the lower impedance opening LIOP of the lower equipotential plate LGPa of FIG. 3A. The differential signal opening DOP, and the first differential signal wiring line DSL1 and the second differential signal wiring line DSL2 of the pair of differential signal wiring lines DSL disposed in the differential signal opening DOP, may overlap the lower equipotential plate LGP in the vertical direction (Z direction).

The semiconductor package 1g may include a wiring insulating layer DLf, a first wiring insulating layer DL1f, and a second wiring insulating layer DL2f, and the wiring insulating layer DLf, the first wiring insulating layer DL1f, and the second wiring insulating layer DL2f may be respectively and substantially the same as the wiring insulating layers DL, DLa, DLb, DLc, and DLd, the first wiring insulating layers DL1, DL1a, DL1b, DL1c, and DL1d, and the second wiring insulating layers DL2, DL2a, DL2b, DL2c, and DL2d of FIGS. 2A, 2B, 2C, 2D and 3A. According to another example embodiment, the wiring insulating layer DLf, the first wiring insulating layer DL1f and the second wiring insulating layer DL2f may not be respectively the same as the wiring insulating layers DL, DLa, DLb, DLc, and DLd, the first wiring insulating layers DL1, DL1a, DL1b, DL1c, and DL1d, and the second wiring insulating layers DL2, DL2a, DL2b, DL2c, and DL2d of FIGS. 2A, 2B, 2C, 2D and 3A.

In the semiconductor package 1g, the upper equipotential plate UGPa may define the upper impedance opening UIOP, and the upper impedance opening UIOP may be disposed above the pair of differential signal wiring lines DSL. Accordingly, the pair of differential signal wiring lines DSL disposed between the upper equipotential plate UGPa and the lower equipotential plate LGP may control impedance by using the upper impedance opening UIOP. When openings are placed above and/or below the signal wiring, the length of the signal path increases, which can increase inductance of the signal wiring. Accordingly, the target impedance of the pair of differential signal wiring lines DSL can be adjusted by arranging openings above and/or below the pair of differential signal wiring lines DSL. Accordingly, as the target impedance of the pair of differential signal wiring lines DSL may be satisfied, the signal integrity of the semiconductor package 1g may be improved.

Figure 3D:
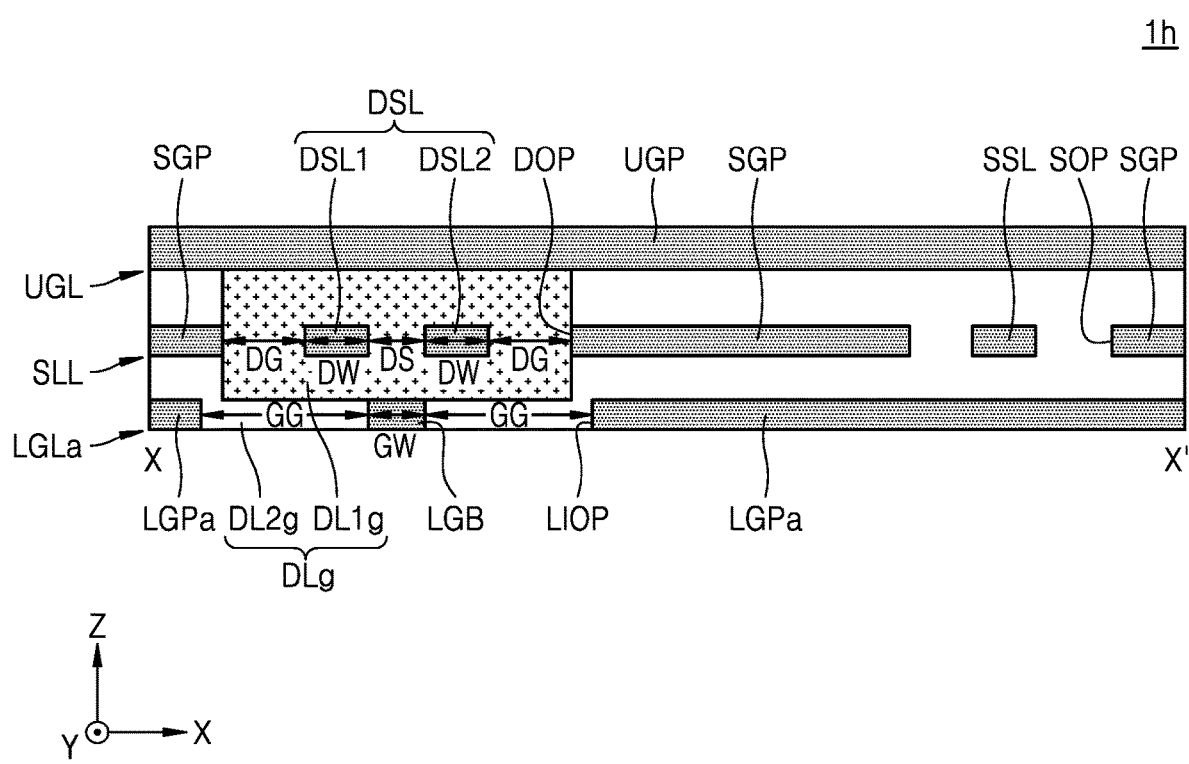

Referring to FIG. 3D, a semiconductor package 1h may include the signal wiring line layer SLL, and the upper wiring layer UGL and the lower wiring layer LGLa respectively disposed above and below the signal wiring line layer SLL. The pair of differential signal wiring lines DSL, the single signal wiring line SSL, and the signal ground plate SGP may be disposed in the signal wiring line layer SLL. An upper equipotential plate UGP may be disposed in the upper wiring layer UGL, and the lower equipotential plate LGPa and the lower equipotential bridge LGB may be disposed in the lower wiring layer LGLa.

The semiconductor package 1h may include, instead of the upper equipotential plate UGPa and the upper equipotential bridge UGB of the upper wiring layer UGLa of the semiconductor package 1e of FIG. 3A, the upper equipotential plate UGPb of the upper wiring layer UGL. The upper equipotential plate UGPb may not define the upper impedance opening UIOP of the upper equipotential plate UGPa of FIG. 3A. The differential signal opening DOP, and the first differential signal wiring line DSL1 and the second differential signal wiring line DSL2 of the pair of differential signal wiring lines DSL disposed in the differential signal opening DOP, may overlap the upper equipotential plate UGP in the vertical direction.

The semiconductor package 1h may include a wiring insulating layer DLg, a first wiring insulating layer DL1g, and a second wiring insulating layer DL2g, and the wiring insulating layer DLg, the first wiring insulating layer DL1g, and the second wiring insulating layer DL2g may be respectively and substantially the same as the wiring insulating layers DL, DLa, DLb, DLc, DLd, DLe, and DLf, the first wiring insulating layers DL1, DL1a, DL1b, DL1c, DL1d, DL1e, and DL1f, and the second wiring insulating layers DL2, DL2a, DL2b, DL2c, and DL2d DL2, DL2a, DL2b, DL2c, DL2d, DL2e, and DL2f of FIGS. 2A, 2B, 2C, 2D, 3A, 3B and 3C. According to another example embodiment, the wiring insulating layers DL, DLa, DLb, DLc, DLd, DLe, and DLf, the first wiring insulating layers DL1, DL1a, DL1b, DL1c, DL1d, DL1e, and DL1f, and the second wiring insulating layers DL2, DL2a, DL2b, DL2c, DL2d, DL2e, and DL2f of FIGS. 2A, 2B, 2C, 2D, 3A, 3B and 3C In the semiconductor package 1h, the lower equipotential plate LGPa may define the lower impedance opening LIOP, and the lower impedance opening LIOP may be disposed below the pair of differential signal wiring lines DSL. Accordingly, the pair of differential signal wiring lines DSL disposed between the upper equipotential plate UGP and the lower equipotential plate LGPa may control impedance by using the lower impedance opening LIOP. When openings are placed above and/or below the signal wiring, the length of the signal path increases, which can increase inductance of the signal wiring. Accordingly, the target impedance of the pair of differential signal wiring lines DSL can be adjusted by arranging openings above and/or below the pair of differential signal wiring lines DSL. Accordingly, as the target impedance of the pair of differential signal wiring lines DSL may be satisfied, the signal integrity of the semiconductor package 1h may be improved.

Figure 4:
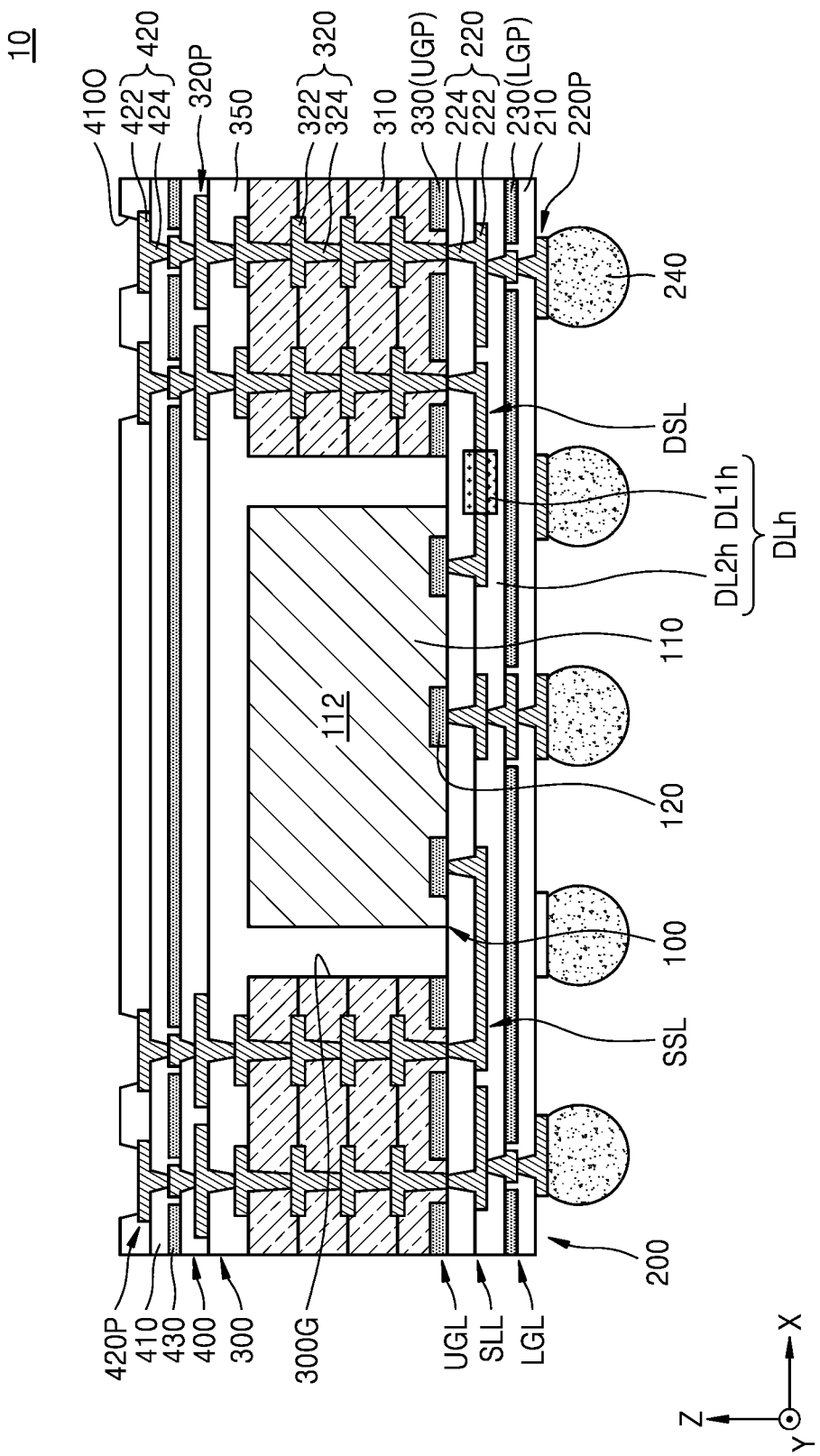
FIG. 4 is a cross-sectional view of a semiconductor package according to some example embodiments.

FIG. 4 is a cross-sectional view of a semiconductor package 10 according to an example embodiment.

Referring to FIG. 4, the semiconductor package 10 may include a lower redistribution layer 200, an expanded layer 300 disposed on the lower redistribution layer 200 and having a mounting space 300G, and at least one semiconductor chip 100 disposed in the mounting space 300G. The expanded layer 300 may surround the at least one semiconductor chip 100.

The semiconductor package 10 may be a fan-out semiconductor package. In some example embodiments, the expanded layer 300 may be a panel board, and the semiconductor package 10 may be a fan-out panel level package (FOPLP). In some example embodiments, the horizontal width and the horizontal area of the mounting space 300G may have a value greater than the horizontal width and the horizontal area of the at least one semiconductor chip 100. The side surface of the at least one semiconductor chip 100 may be spaced apart from the inner surface of the mounting space 300G.

The at least one semiconductor chip 100 may include a semiconductor substrate 110 having an active surface on which a semiconductor device 112 is formed, and a plurality of chip connection pads 120 disposed on the active surface of the semiconductor substrate 110. In some example embodiments, when the semiconductor package 10 is a lower package of a package-on-package (PoP), the semiconductor package 10, the at least one semiconductor chip 100, the semiconductor substrate 110, the semiconductor device 112, and the chip connection pads 120 may be referred to as a first semiconductor package, a first semiconductor chip, a first semiconductor substrate, a first semiconductor device, and a first chip connection pad, respectively.

The semiconductor substrate 110 may include a semiconductor material, for example, silicon (Si). Alternatively, the semiconductor substrate 110 may include a semiconductor element, such as germanium Ge, or a compound semiconductor, such as silicon carbide (SiC), gallium arsenide (GaAs), indium arsenide (InAs), and indium phosphide (InP). The semiconductor substrate 110 may include a conductive region, for example, a well doped with impurities. The semiconductor substrate 110 may have various device isolation structures, such as a shallow trench isolation (STI) structure.

The semiconductor device 112 may include various types of a plurality of individual devices, which may be formed on the active surface of the semiconductor substrate 110. The individual devices may include various microelectronic devices, for example, metal-oxide-semiconductor field effect transistors (MOSFET) such as complementary metal-insulator-semiconductor (CMOS) transistors, image sensors, such as system large scale integration (LSI), CMOS imaging sensors (CIS), and the like, micro-electro-mechanical systems (MEMS), active devices, passive devices, and the like. The individual devices may be electrically connected to the conductive region of the semiconductor substrate 110. The semiconductor device 112 may further include a conductive wiring or a conductive plug that electrically connects at least two of the individual devices, or the individual devices to the conductive region of the semiconductor substrate 110. Furthermore, the individual devices may each be electrically isolated from other neighboring individual devices by an insulating film.

The at least one semiconductor chip 100 may include, for example, a central processing unit (CPU) chip, a graphics processing unit (GPU) chip, or an application processor (AP) chip. In some example embodiments, when the semiconductor package 10 includes a plurality of semiconductor chips 100, some of the semiconductor chips 100 may include, for example, dynamic random access memory (DRAM) chips, static random access memory (SRAM) chips, flash memory chips, electrically erasable and programmable read-only memory (EEPROM) chips, phase-change random access memory (PRAM) chips, magnetic random access memory (MRAM) chips, or resistive random access memory (RRAM) chips.

The lower redistribution layer 200 may include at least one lower redistribution insulating layer 210, a lower redistribution conductive structure 220, and a lower redistribution plate 230. The at least one lower redistribution insulating layer 210 may surround at least one part of the lower redistribution conductive structure 220 and the lower redistribution plate 230. The lower redistribution conductive structure 220 may include a plurality of lower redistribution line patterns 222 disposed on at least one of the upper and lower surfaces of the at least one lower redistribution insulating layer 210, and a plurality of lower redistribution via patterns 224 in contact with and connected to portions of the lower redistribution line patterns 222 by penetrating at least a portion of the at least one lower redistribution insulating layer 210. The lower redistribution plate 230 may be disposed on at least one of the upper and lower surfaces of the at least one lower redistribution insulating layer 210. Although FIG. 4 illustrates that the lower redistribution line patterns 222 and the lower redistribution plate 230 are disposed on different wiring layers, the disclosure is not limited thereto. For example, the lower redistribution layer 200 may include a plurality of lower redistribution plates 230, and at least one of the lower redistribution plates 230 may be the equipotential plate GP, discussed above with respect to FIGS. 1 and 3, disposed on a different wiring layer from the lower redistribution line patterns 222, and the other of the lower redistribution plates 230 may be the surrounding equipotential plate SGP, discussed above with respect to FIGS. 1 and 3, disposed on the same wiring layer as the lower redistribution line patterns 222.

The at least one lower redistribution insulating layer 210 may include a wiring insulating layer DLh, and the wiring insulating layer DLh may include a first wiring insulating layer DL1h and a second wiring insulating layer DL2h. The at least one lower redistribution layer 200 may include a plurality of lower redistribution insulating layers 210, and the first wiring insulating layer DL1h may be disposed over at least two of the lower redistribution insulating layers 210. The first wiring insulating layer DL1h may surround the pair of differential signal wiring lines DSL.

The lower redistribution line patterns 222, the lower redistribution via patterns 224, and the lower redistribution plate 230 may each include a metal, such as Cu, Al, W, Ti, Ta, In, Mo, Mn, Co, Sn, Ni, Mg, Re, Be, Ga, Ru, and the like, or an alloy thereof, but the disclosure is not limited thereto.

At least portions of the lower redistribution line patterns 222 may be formed in one body with portions of the lower redistribution via patterns 224. For example, portions of the lower redistribution line patterns 222 may be formed in one body with portions of the lower redistribution via patterns 224 in contact with the upper side of portions of the lower redistribution line patterns 222.

In some example embodiments, each of the lower redistribution via patterns 224 may have a tapered shape such that a horizontal width thereof decreases while extending from the lower side to the upper side. For example, each of the lower redistribution via patterns 224 may have a horizontal width that increases as distance from the at least one semiconductor chip 100 increases. In some example embodiments, each of the lower redistribution via patterns 224 may have a horizontal width that decreases as distance from the lower redistribution line patterns 222 increases, forming one body, among the lower redistribution line patterns 222.

A lower redistribution seed layer may be provided between the lower redistribution line patterns 222, the lower redistribution via patterns 224, and the lower redistribution plate 230, and the at least one lower redistribution insulating layer 210. For example, the lower redistribution seed layer may be formed by performing physical vapor deposition, and the lower redistribution line patterns 222, the lower redistribution via patterns 224, and the lower redistribution plate 230 may be formed through a plating process using the lower redistribution seed layer as a seed. In some example embodiments, the lower redistribution seed layer may be provided between the at least one lower redistribution insulating layer 210 and the upper surface of each of the lower redistribution line patterns 222, the lower redistribution via patterns 224, and the lower redistribution plate 230, and between the side surfaces of the lower redistribution via patterns 224 and the at least one lower redistribution insulating layer 210. The lower redistribution seed layer may be selected from the group consisting of, for example, Cu, Ti, titanium tungsten (TiW), titanium nitride (TiN), Ta, tantalum nitride (TaN), chromium (Cr), Al, and the like. However, the lower redistribution seed layer is not limited the above materials. In some example embodiments, the lower redistribution seed layer may be Cu/Ti in which copper is stacked on titanium, or Cu/TiW in which copper is stacked on TiW.

In some example embodiments, when Cu is used as the lower redistribution line patterns 222, the lower redistribution via patterns 224, and the lower redistribution plate 230, at least a portion of the lower redistribution seed layer may be function as a diffusion barrier layer.

The at least one lower redistribution insulating layer 210 may include a material film consisting of, for example, an organic compound. In some example embodiments, the at least one lower redistribution insulating layer 210 may be formed from a material film including an organic polymer material. In some example embodiments, the at least one lower redistribution insulating layer 210 may be formed from PSPI.

The chip connection pads 120 of the at least one semiconductor chip 100 may be electrically connected to the lower redistribution conductive structure 220. In some example embodiments, portions of the top ones of the lower redistribution via patterns 224 may be in contact with the chip connection pads 120, but the disclosure is not limited thereto. In some example embodiments, portions of the top ones of the lower redistribution via patterns 224 may be in contact with the chip connection pads 120. An external connection terminal 240 electrically connected to the lower redistribution conductive structure 220 may be attached to the lower side of the lower redistribution layer 200. In some example embodiments, at least a portion of each of the lower redistribution line patterns 222 at the bottom of the lower redistribution line patterns 222 may be a terminal connection pad 220P to which the external connection terminal 240 is attached.

The expanded layer 300 may be, for example, a printed circuit board (PCB), a ceramic substrate, a package manufacturing wafer, or an interposer. In some example embodiments, the expanded layer 300 may be a multi-layer PCB. The mounting space 300G may be formed in the expanded layer 300 as an opening portion or cavity. The mounting space 300G may be formed in a partial area, for example, at a central area, of the expanded layer 300. The mounting space 300G may be formed by being recessed or opened from the upper surface of the expanded layer 300 to a certain depth. To recess or open the expanded layer 300, dry etching, wet etching, screen print, drill bits, a laser drilling process, and the like may be used.

The expanded layer 300 may include a substrate base 310, a wiring structure 320, and a substrate equipotential plate 330. The wiring structure 320 may include a wiring pattern 322 and a conductive via 324. The wiring structure 320 and the substrate equipotential plate 330 may each include copper, nickel, stainless steel, or beryllium copper.

The substrate base 310 may include at least one material selected from among phenol resin, epoxy resin, and polyimide. The substrate base 310 may include at least one material selected from, for example, FR-4, tetrafunctional epoxy, polyphenylene ether, epoxy/polyphenylene oxide, BT, thermount, cyanate ester, polyimide, and liquid crystal polymer.

In some example embodiments, the expanded layer 300 may be a multilayer substrate in which the substrate base 310 includes a plurality of layers. The expanded layer 300 may include the wiring pattern 322 that is disposed between the respective layers of the substrate base 310, and at least a partial surface of the upper and lower surfaces the layers of the substrate base 310. The substrate equipotential plate 330 may be disposed on at least one of the upper and lower surfaces of the plurality of layers of the substrate base 310.

The expanded layer 300 may further include a plurality of conductive vias 324 that penetrate at least portions of the substrate base 310 and the substrate equipotential plate 330 to electrically connect the wiring patterns 322 disposed on different wiring layers. In some example embodiments, the expanded layer 300 may have a plurality of wiring layers greater, by one, than the number of the layers of the substrate base 310.

The semiconductor package 10 may further include a cover insulating layer 350 filling the space between the at least one semiconductor chip 100 and the expanded layer 300. In some example embodiments, the cover insulating layer 350 may fill the space between the at least one semiconductor chip 100 and the expanded layer 300, and cover the upper surfaces of the at least one semiconductor chip 100 and the expanded layer 300. For example, the cover insulating layer 350 may include thermosetting resin such as epoxy resin, thermoplastic resin such as polyimide, or such resin including a reinforcement member such as an inorganic filler, in detail, ABF, FR-4, BT, and the like. Alternatively, the cover insulating layer 350 may include a molding material such as an epoxy mold compound (EMC) or a photosensitive material such as a photoimageable encapsulant (PIE). In some example embodiments, a portion of the cover insulating layer 350 may include an insulating material, such as a silicon oxide film, a silicon nitride film, or a silicon oxynitride film.

The semiconductor package 10 may further include an upper redistribution layer 400 disposed on the cover insulating layer 350. The upper redistribution layer 400 may include at least one upper redistribution insulating layer 410, an upper redistribution conductive structure 420, and an upper redistribution plate 430. The upper redistribution conductive structure 420 may include a plurality of upper redistribution line patterns 422 disposed on at least one of the upper and lower surfaces of the at least one upper redistribution insulating layer 410, and a plurality of upper redistribution via patterns 424 penetrating at least a portion of the at least one upper redistribution insulating layer 410 and in contact with and connected to a portion of the upper redistribution line patterns 422. The upper redistribution plate 430 may be disposed on at least one of the upper and lower surfaces of the at least one upper redistribution insulating layer 410. The upper redistribution insulating layer 410, the upper redistribution conductive structure 420 including the upper redistribution line patterns 422 and the upper redistribution via patterns 424, and the upper redistribution plate 430 included in the upper redistribution layer 400 may be respectively and substantially similar to the at least one lower redistribution insulating layer 210, the lower redistribution conductive structure 220 including the lower redistribution line patterns 222 and the lower redistribution via patterns 224, and the lower redistribution plate 230 included in the lower redistribution layer 200, and thus, redundant descriptions thereof are omitted.

At least a portion of the upper redistribution line patterns 422 may be formed in one body with a portion of the upper redistribution via patterns 424. For example, portions of the upper redistribution line patterns 422 may be formed in one body with portions of the upper redistribution via patterns 424 in contact with the lower sides of the portions of the upper redistribution line patterns 422.

In some example embodiments, each of the upper redistribution via patterns 424 may have a tapered shape such that a horizontal width thereof increases while extending from the lower side to the upper side. For example, each of the upper redistribution via patterns 424 may have a horizontal width that increases as from the at least one semiconductor chip 100 increases. In some example embodiments, each of the upper redistribution via patterns 424 may have a horizontal width that decreases as distance from the upper redistribution line patterns 422 increases, forming one body, among the upper redistribution line patterns 422.

The upper redistribution line pattern 422 at the top of the upper redistribution line patterns 422 may be a package connection pad 420P in which a portion of a surface thereof is exposed, not being covered by the upper redistribution insulating layer 410. In some example embodiments, when the semiconductor package 10 is a lower package of a package-on-package, an upper package of the package-on-package may be connected to the package connection pad 420P.

In some example embodiments, a wiring layer at the top of a plurality of wiring layers of the lower redistribution layer 200 may be the signal wiring line layer SLL, and a wiring layer below the top, that is, next to the top, may be the lower wiring layer LGL. A wiring layer at the bottom of the wiring layers of the expanded layer 300 may be the upper wiring layer UGL.

Some of the lower redistribution line patterns 222 disposed in the signal wiring line layer SLL may be the differential signal wiring lines DSL, and some others may be the single signal wiring line SSL. The lower redistribution plate 230 disposed in the lower wiring layer LGL may be the lower equipotential plate LGP defining the lower impedance opening LIOP, and the substrate equipotential plate 330 disposed in the upper wiring layer UGL may be the upper equipotential plate UGP defining the upper impedance opening UIOP. The lower impedance opening LIOP and the upper impedance opening UIOP may each overlap the differential signal wiring lines DSL in the vertical direction (Z direction).

The differential signal wiring lines DSL and the single signal wiring line SSL may each electrically connect between the chip connection pads 120 of the at least one semiconductor chip 100 and the package connection pad 420P. The chip connection pads 120 and the package connection pad 420P may be electrically connected to each other through one of the differential signal wiring lines DSL and the single signal wiring line SSL, the wiring structure 320, and the upper redistribution conductive structure 420. The differential signal wiring lines DSL and the single signal wiring line SSL may each extend from a portion of the lower redistribution layer 200 below the at least one semiconductor chip 100 to a portion of the lower redistribution layer 200 below the expanded layer 300. The lower impedance opening LIOP may be disposed across a portion of the lower redistribution layer 200 below the at least one semiconductor chip 100, a portion of the lower redistribution layer 200 below the cover insulating layer 350, and a portion of the lower redistribution layer 200 below the expanded layer 300. The upper impedance opening UIOP may be disposed only in a portion of the expanded layer 300.

The signal wiring line layer SLL, the differential signal wiring lines DSL, and the single signal wiring line SSL of FIG. 4 may be the signal wiring line layer SLL, the differential signal wiring lines DSL, and the single signal wiring line SSL of FIG. 2A, respectively.

The lower wiring layer LGL of FIG. 4 may be the lower wiring layers LGL and LGLa of FIGS. 2A and 3A, and may define a lower impedance opening LIOP such as the lower impedance opening LIOP of FIG. 3A, and the lower equipotential plate LGP may be the lower equipotential plates LGP and LGPa of FIGS. 2A and 3A.

The upper wiring layer UGL of FIG. 4 may be the upper wiring layers UGL and UGLa of FIGS. 2A and 3A, and may define an upper impedance opening UIOP such as the upper impedance opening UIOP of FIG. 3A, and the upper equipotential plate UGP may be the upper equipotential plates UGP and UGPa of FIGS. 2A and 3A.

In another example embodiment, the at least one lower redistribution insulating layer 210 and the substrate base 310 of FIG. 4 may constitute the wiring insulating layers DL, DLa, DLb, DLc, DLd, DLe, DLf, and DLg of FIGS. 2A, 2B, 2C, 2D, 3A, 3B, 3C and 3D.

Although not separately illustrated, in the semiconductor package 10, the lower equipotential bridge LGB of FIG. 3A may be disposed in the lower wiring layer LGL, and the upper equipotential bridge UGB of FIG. 3A may be disposed in the upper wiring layer UGL.

Figure 5A:
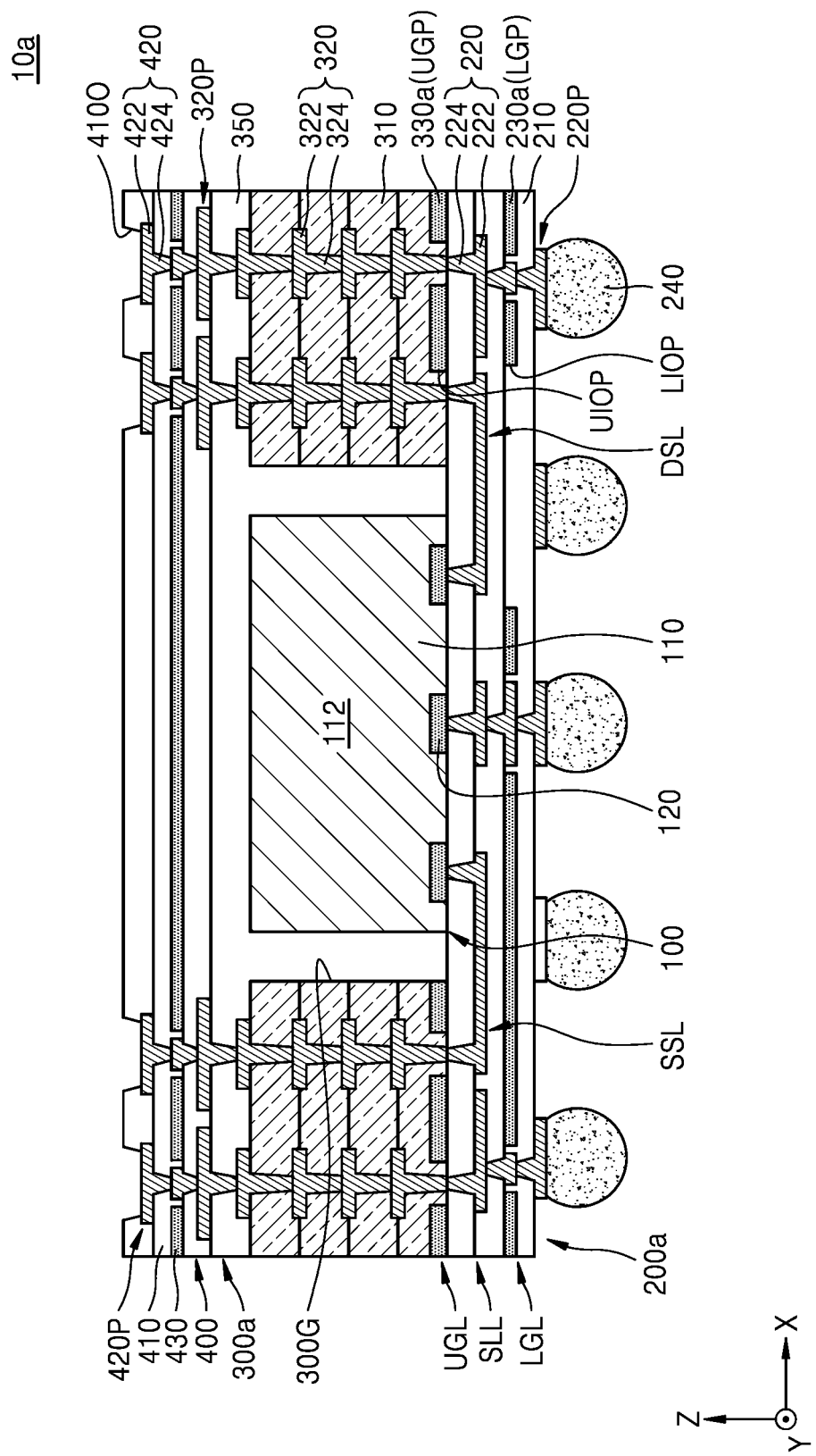
FIGS. 5A, 5B and 5C are cross-sectional views of semiconductor packages according to some example embodiments.
Figure 5B:
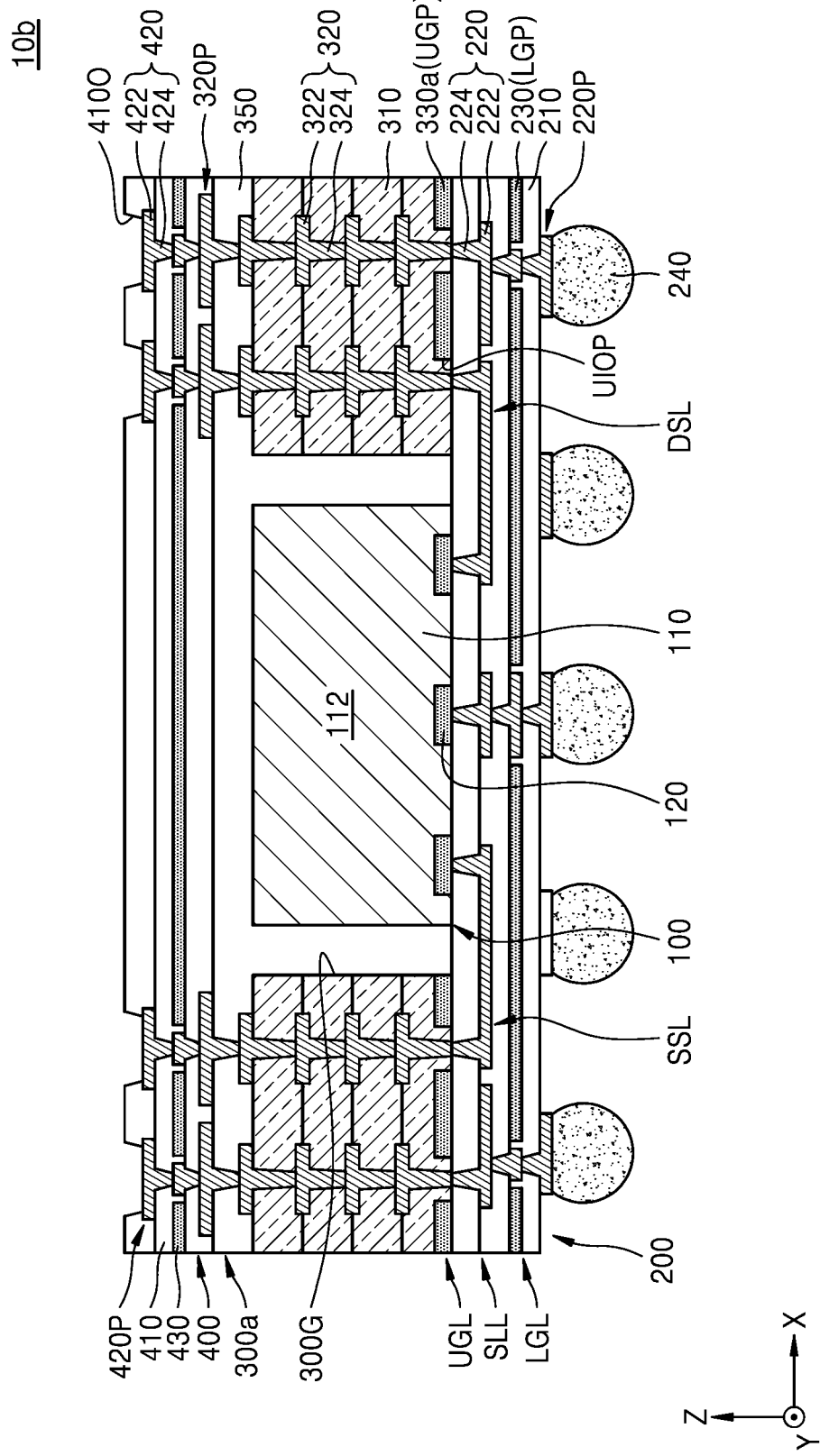
Figure 5C:
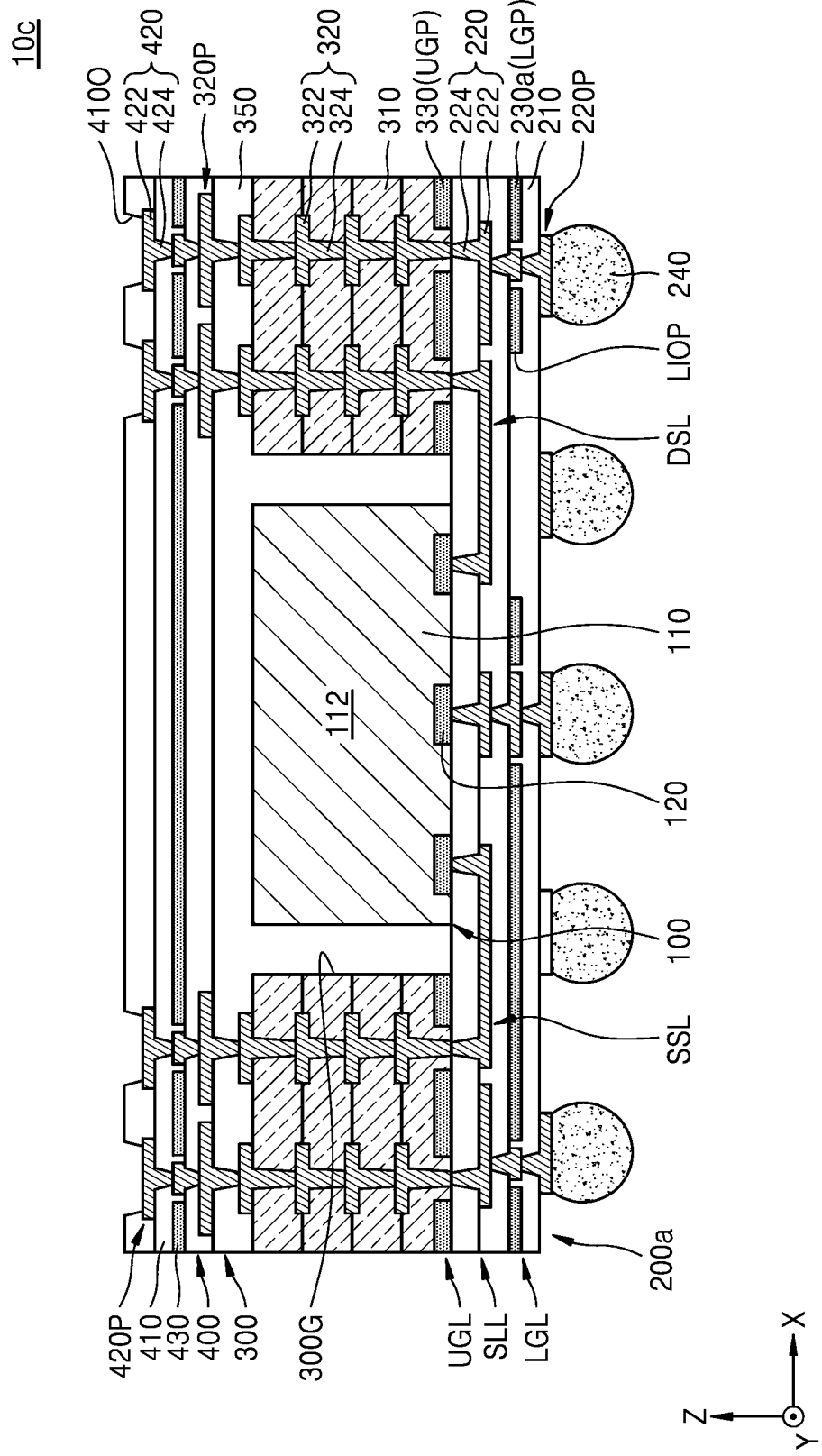

FIGS. 5A, 5B and 5C are cross-sectional views of semiconductor packages according to some example embodiments. In FIGS. 5A, 5B and 5C, the same reference names as those of FIG. 4 denote substantially the same elements or modified elements, like reference numerals denote substantially the same elements, and any description redundant to the description of FIG. 4 may be omitted.

Referring to FIG. 5A, a semiconductor package 10a may include a lower redistribution layer 200a, an expanded layer 300a disposed on the lower redistribution layer 200a and having the mounting space 300G, the at least one semiconductor chip 100 disposed in the mounting space 300G, and the upper redistribution layer 400 disposed on the expanded layer 300a and the at least one semiconductor chip 100. The lower redistribution layer 200a may include the at least one lower redistribution insulating layer 210, the lower redistribution conductive structure 220, and a lower redistribution plate 230a. The expanded layer 300a may include the substrate base 310, the wiring structure 320, and a substrate equipotential plate 330a.

In some example embodiments, a wiring layer at the top of a plurality of wiring layers of the lower redistribution layer 200a may be the signal wiring line layer SLL, and a wiring layer below the top, that is, next to the top, may be the lower wiring layer LGL. A wiring layer at the bottom of the wiring layers of the expanded layer 300a may be the upper wiring layer UGL. The lower redistribution plate 230 disposed in the lower wiring layer LGL may be the lower equipotential plate LGP, and an equipotential plate 330a disposed in the upper wiring layer UGL may be the upper equipotential plate UGPa defining the upper impedance opening UIOP. The upper impedance opening UIOP may overlap a portion of the differential signal wiring lines DSL in the vertical direction (Z direction), the differential signal wiring lines DSL overlapping the expanded layer 300a in the vertical direction (Z direction).

Although not separately illustrated, in the semiconductor package 10a, the upper equipotential bridge UGB of FIG. 3A may be disposed in the upper wiring layer UGL. Furthermore, in the semiconductor package 10a, the lower equipotential bridge LGB of FIG. 3A may be disposed in the lower wiring layer LGL.

Referring to FIG. 5B, a semiconductor package 10b may include the lower redistribution layer 200, the expanded layer 300a disposed in the lower redistribution layer 200 and having the mounting space 300G, the at least one semiconductor chip 100 disposed in the mounting space 300G, and the upper redistribution layer 400 disposed on the expanded layer 300a and the at least one semiconductor chip 100. The expanded layer 300a may include the substrate base 310, the wiring structure 320, and the substrate equipotential plate 330a.

Although not separately illustrated, in the semiconductor package 10b, the upper equipotential bridge UGB of FIG. 3A may be disposed in the upper wiring layer UGL.

Referring to FIG. 5C, a semiconductor package 10c may include the lower redistribution layer 200a, the expanded layer 300 disposed on the lower redistribution layer 200 and having the mounting space 300G, the at least one semiconductor chip 100 disposed in the mounting space 300G, and the upper redistribution layer 400 disposed on the expanded layer 300 and the at least one semiconductor chip 100. The lower redistribution layer 200a may include the at least one lower redistribution insulating layer 210, the lower redistribution conductive structure 220, and the lower redistribution plate 230a.

Although not separately illustrated, in the semiconductor package 10c, the lower equipotential bridge LGB of FIG. 3A may be disposed in the lower wiring layer LGL.

FIGS. 6A, 6B, 6C and 6D are cross-sectional views of package-on-packages having a semiconductor package, according to some example embodiments.

Figure 6A:
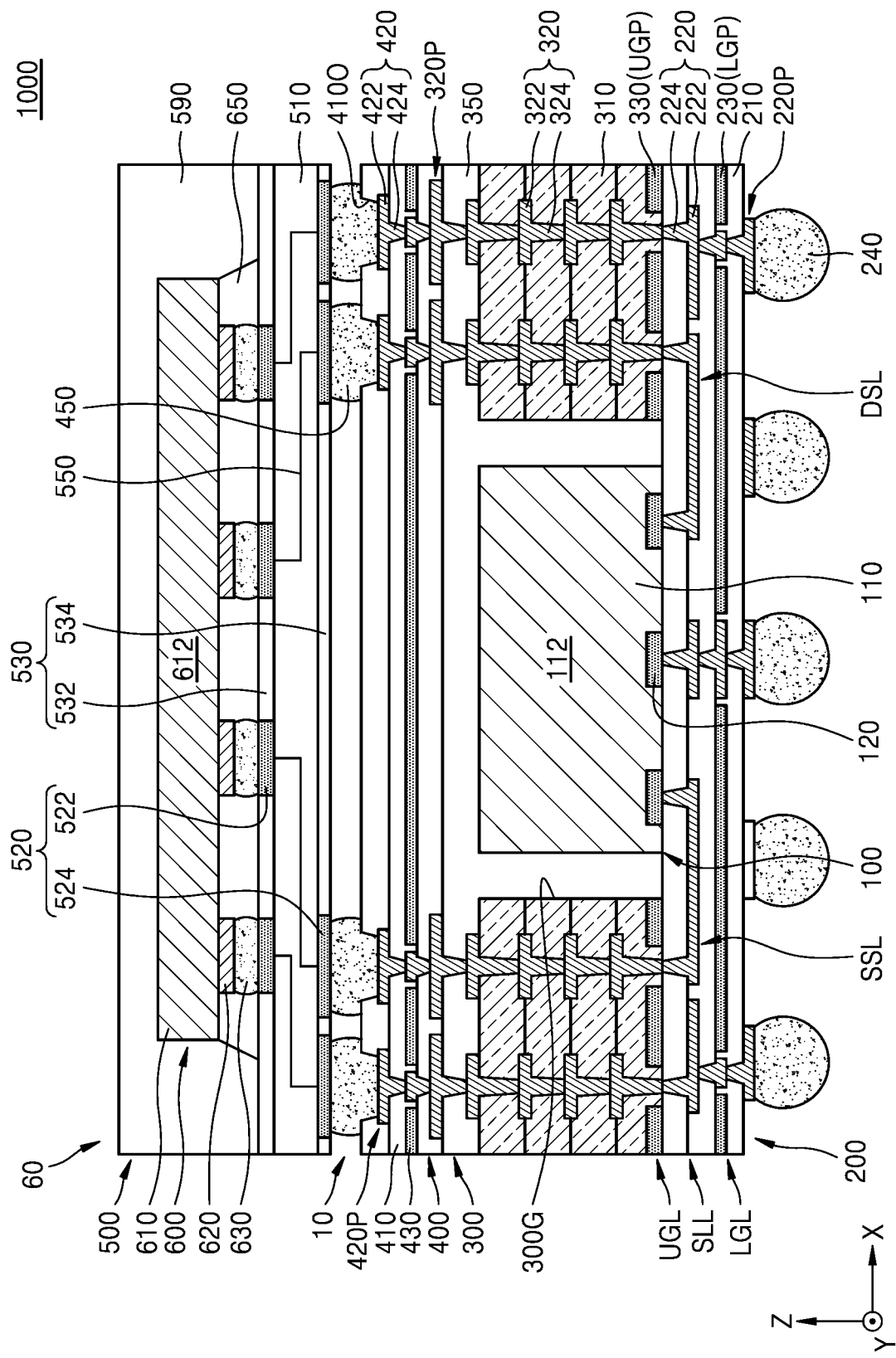
FIGS. 6A, 6B, 6C and 6D are cross-sectional views of package-on-packages having a semiconductor package, according to some example embodiments.

Referring to FIG. 6A, a package-on-package 1000 may include a second semiconductor package 60 stacked on the first semiconductor package 10. The first semiconductor package 10 may be a lower package, and the second semiconductor package 60 may be an upper package. As the first semiconductor package 10, the first semiconductor chip 100, the first semiconductor substrate 110, the first semiconductor device 112, and the first chip connection pads 120 are respectively and substantially the same as the semiconductor package 10, the at least one semiconductor chip 100, the semiconductor substrate 110, the semiconductor device 112, and the chip connection pads 120, which are described with reference to FIG. 4, detailed descriptions thereof are omitted.

The second semiconductor package 60 may include at least one second semiconductor chip 600. The second semiconductor package 60 may be electrically connected to the first semiconductor package 10 through a plurality of package connection terminals 450 attached to the package connection pads 420P of the first semiconductor package 10.

The second semiconductor chip 600 may include a second semiconductor substrate 610 having an active surface on which a second semiconductor device 612 is formed, and a plurality of second chip connection pads 620 disposed in the active surface of the second semiconductor substrate 610. As the second semiconductor substrate 610, the second semiconductor device 612, and the second chip connection pads 620 are respectively and substantially similar to the semiconductor substrate 110, the semiconductor device 112, and the chip connection pads 120, which are described with reference to FIG. 4, redundant descriptions thereof are omitted. The at least one second semiconductor chip 600 may be a memory semiconductor chip. The at least one second semiconductor chip 600 may include, for example, a DRAM chip, an SRAM chip, a flash memory chip, an EEPROM chip, a PRAM chip, an MRAM chip, or an RRAM chip.

Although FIG. 6A illustrates that the at least one second semiconductor chip 600 of the second semiconductor package 60 is mounted on a package base substrate 500 by a flip chip method, this is an example, and the disclosure is not limited thereto. The package-on-package 1000 may include, as an upper package, any type of semiconductor packages including the at least one second semiconductor chip 600 and having the package connection terminals 450 at a lower side thereof to be electrically connected to the first semiconductor package 10.

The package base substrate 500 may include a base board layer 510, and a plurality of board pads 520 disposed on the upper and lower surfaces of the base board layer 510. The board pads 520 may include a plurality of board upper surface pads 522 disposed on the upper surface of the base board layer 510 and a plurality of board lower surface pads 524 disposed on the lower surface of the base board layer 510. In some example embodiments, the package base substrate 500 may be a printed circuit board. For example, the package base substrate 500 may be a multilayer printed circuit board. The base board layer 510 may include at least one material selected from among phenol resin, epoxy resin, and polyimide.

A solder resist layer 530 for exposing the board pads 520 may be formed on the upper and lower surfaces of the base board layer 510. The solder resist layer 530 may include an upper surface solder resist layer 532 covering the upper surface of the base board layer 510 and exposing the board upper surface pads 522, and a lower surface solder resist layer 534 covering the lower surface of the base board layer 510 and exposing the board lower surface pads 524.

The package base substrate 500 may include a board wiring 550 electrically connecting between the board upper surface pads 522 and the board lower surface pads 524, inside the base board layer 510. The board wiring 550 may include a board wiring line and a board wiring via. The board wiring 550 may include copper, nickel, stainless steel, or beryllium copper.

The board upper surface pads 522 may be electrically connected to the at least one second semiconductor chip 600. For example, a plurality of chip connection terminals 630 are disposed between a plurality of the second chip connection pads 620 of the at least one second semiconductor chip 600 and the board upper surface pads 522 of the package base substrate 500, to electrically connect the at least one second semiconductor chip 600 to the package base substrate 500. In some example embodiments, an underfill layer 650 surrounding the chip connection terminals 630 may be provided between the at least one second semiconductor chip 600 and the package base substrate 500. For example, the underfill layer 650 may include epoxy resin and may be formed by a capillary underfill method. In some example embodiments, the underfill layer 650 may be a non-conductive film (NCF).

A molding layer 690 surrounding the at least one second semiconductor chip 600 may be disposed on the package base substrate 500. The molding layer 690 may include, for example, an epoxy mold compound (EMC).

The package connection terminals 450 may be attached to the board lower surface pads 524. The package connection terminals 450 may be provided between the package connection pads 420P and the board lower surface pads 524, to electrical connect the first semiconductor package 10 to the second semiconductor package 60.

Figure 6B:
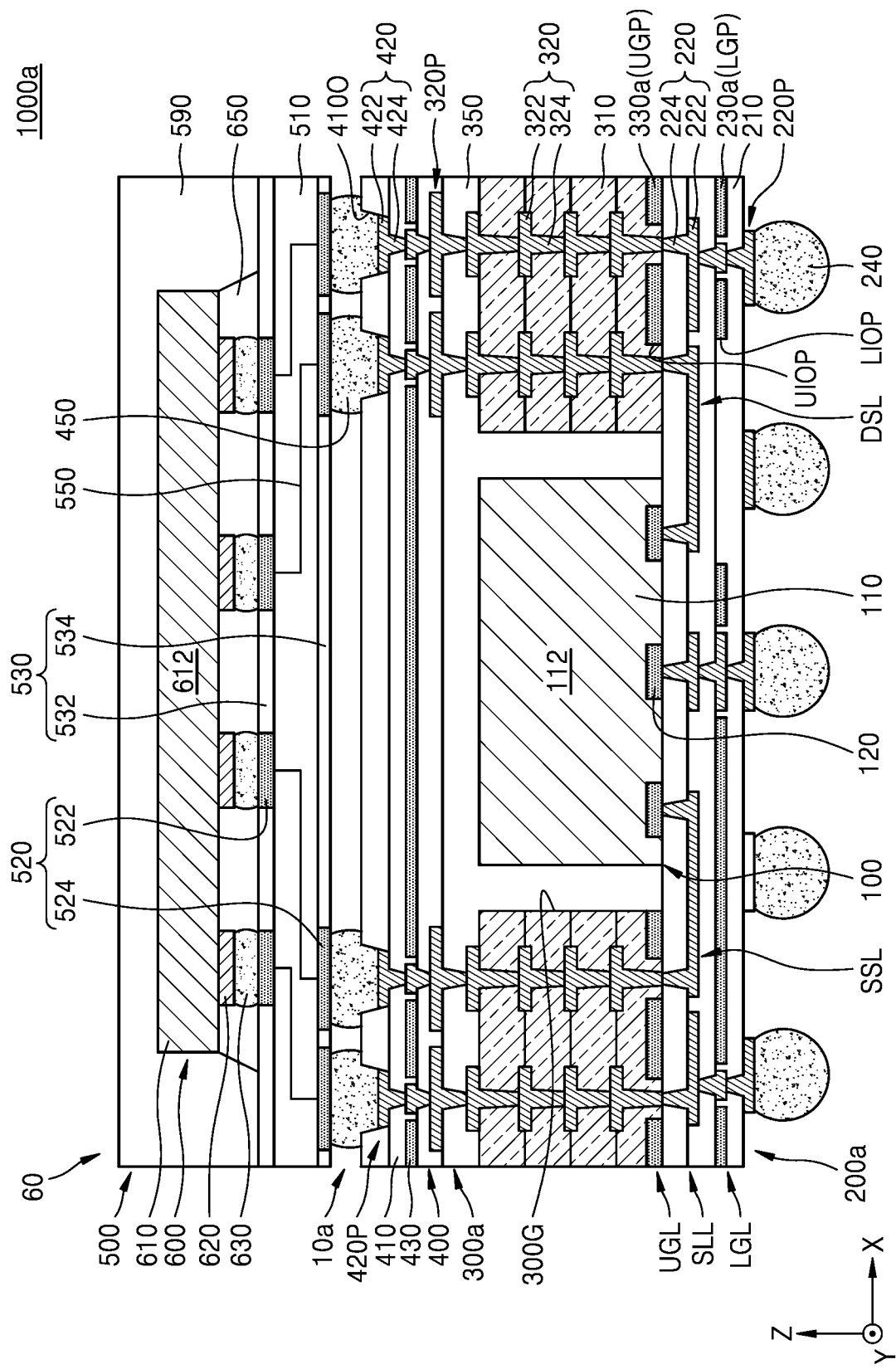

Referring to FIG. 6B, a package-on-package 1000a may include the second semiconductor package 60 stacked on the first semiconductor package 10a. The first semiconductor package 10a may be a lower package, and the second semiconductor package 60 may be an upper package. As the first semiconductor package 10a is substantially the same the semiconductor package 10a described with reference to FIG. 5A, detailed descriptions thereof are omitted.

Figure 6C:
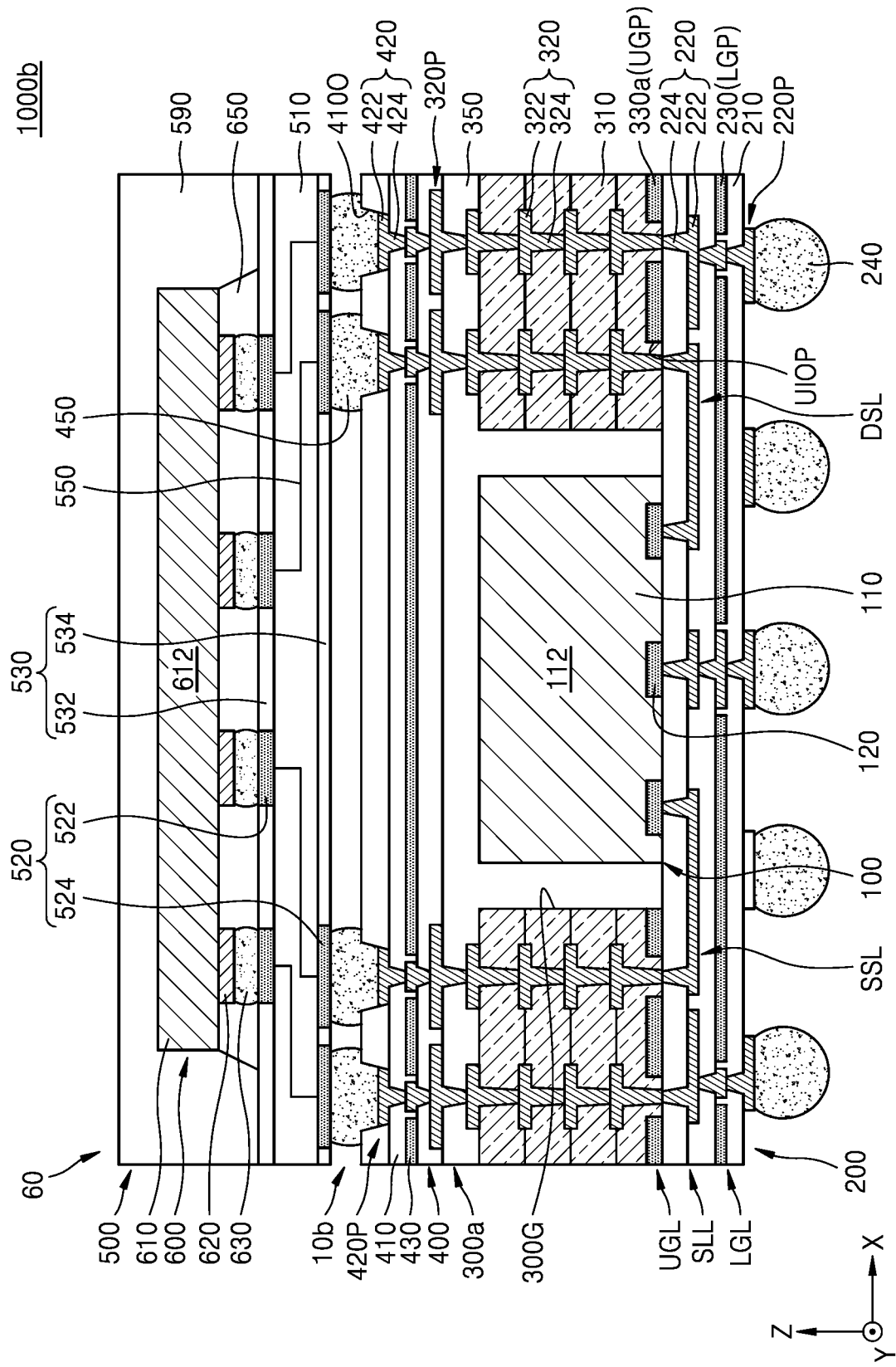

Referring to FIG. 6C, a package-on-package 1000b may include the second semiconductor package 60 stacked on the first semiconductor package 10b. The first semiconductor package 10b may be a lower package, and the second semiconductor package 60 may be an upper package. As the first semiconductor package 10b is substantially the same as the semiconductor package 10b described with reference to FIG. 5B, detailed descriptions thereof are omitted.

Figure 6D:
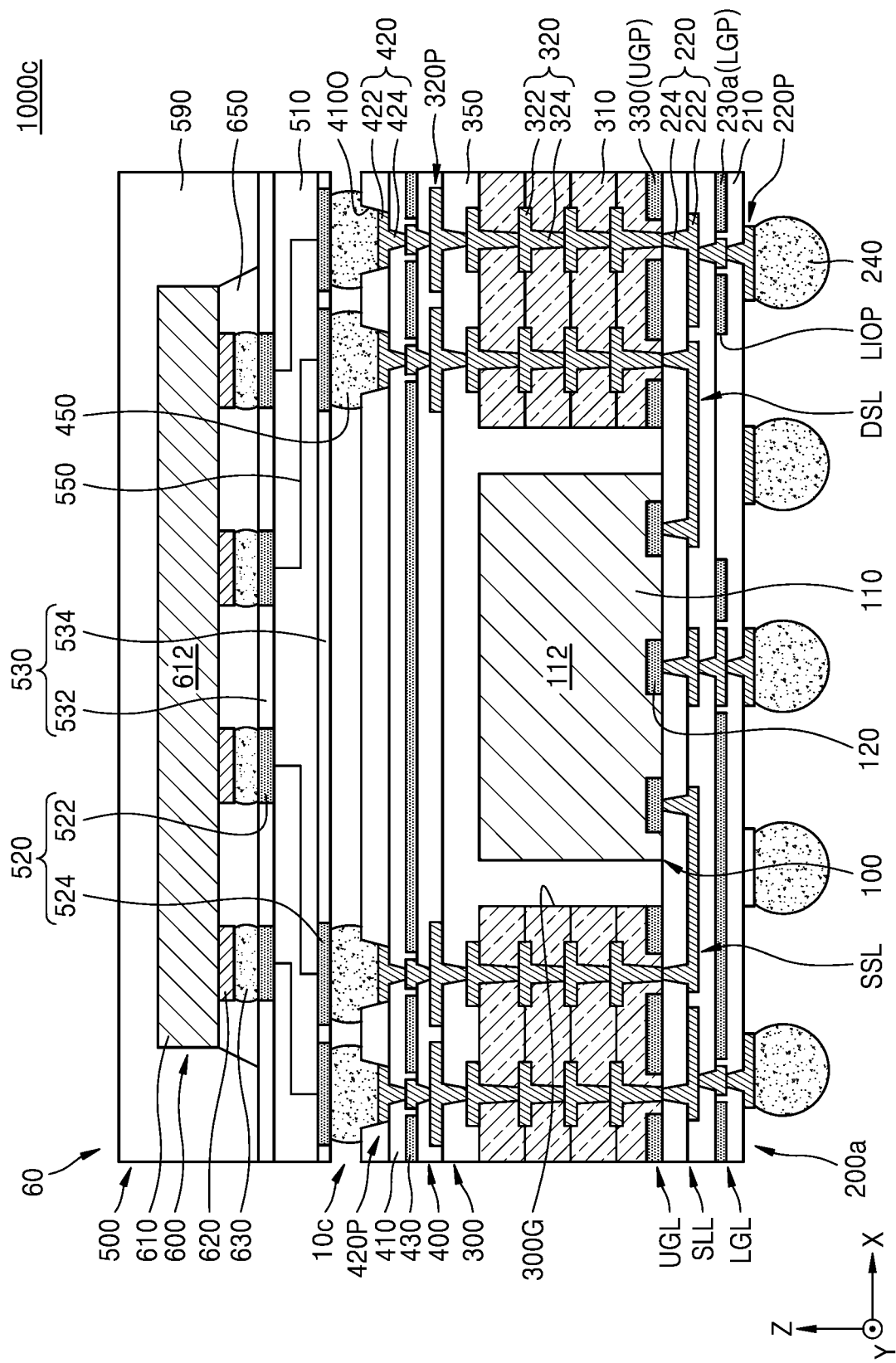

Referring to FIG. 6D, a package-on-package 1000c may include the second semiconductor package 60 stacked on the first semiconductor package 10c. The first semiconductor package 10c may be a lower package, and the second semiconductor package 60 may be an upper package. As the first semiconductor package 10c is substantially the same as the semiconductor package 10c described with reference to FIG. 5C, detailed descriptions thereof are omitted.

While aspects of example embodiments have been particularly shown and described, it will be understood that various changes in form and details may be made therein without departing from the spirit and scope of the following claims.

What is claimed is:

1. A semiconductor package comprising:
    a lower equipotential plate provided in a lower wiring layer;
    an upper equipotential plate provided in an upper wiring layer, wherein the upper equipotential plate overlaps the lower equipotential plate along a vertical direction;
    a pair of differential signal wiring lines provided in a signal wiring layer that is between the lower equipotential plate and the upper equipotential plate, wherein the pair of differential signal wiring lines comprises a first differential signal wiring line and a second differential signal wiring line which are spaced apart from each other along a first horizontal direction and extend in parallel along a second horizontal direction which crosses the first horizontal direction; and
    a wiring insulating layer surrounding the pair of differential signal wiring lines, and filling between the signal wiring layer, the lower wiring layer, and the upper wiring layer,
    wherein the wiring insulating layer comprises a first wiring insulating layer surrounding the pair of differential signal wiring lines, and a second wiring insulating layer, and
    the first wiring insulating layer and the second wiring insulating layer comprise different materials.

2. The semiconductor package of claim 1, wherein the pair of differential signal wiring lines and the second wiring insulating layer are spaced apart from each other by the first wiring insulating layer.

3. The semiconductor package of claim 1, wherein an upper surface of the first wiring insulating layer is in contact with a lower surface of the upper equipotential plate, or a lower surface of the first wiring insulating layer is in contact with an upper surface of the lower equipotential plate.

4. The semiconductor package of claim 1, wherein at least one equipotential plate of the lower equipotential plate and the upper equipotential plate overlaps the pair of differential signal wiring lines along the vertical direction and defines an impedance opening filled with the wiring insulating layer.

5. The semiconductor package of claim 4, wherein the impedance opening comprises a lower impedance opening in the lower equipotential plate, and an upper impedance opening in the upper equipotential plate, and
    the pair of differential signal wiring lines do not overlap the lower equipotential plate and the upper equipotential plate along the vertical direction.

6. The semiconductor package of claim 4, further comprising an equipotential bridge extending in the lower wiring layer or the upper wiring layer to bisect the impedance opening.

7. The semiconductor package of claim 1, further comprising:
    a lower redistribution layer comprising the signal wiring layer, the lower wiring layer, and a lower redistribution conductive structure comprising a lower redistribution insulating layer and the pair of differential signal wiring lines;
    an expanded layer comprising the upper wiring layer, a substrate base, a wiring structure, and the upper equipotential plate; and
    a semiconductor chip attached to the lower redistribution layer,
    wherein a lower portion of the wiring insulating layer is a portion of the lower redistribution insulating layer, and an upper portion of the wiring insulating layer is a portion of the substrate base.

8. The semiconductor package of claim 1, wherein a first relative dielectric constant of the first wiring insulating layer is less than a second relative dielectric constant of the second wiring insulating layer.

9. A semiconductor package comprising:
a lower redistribution layer comprising a plurality of lower redistribution line patterns, a plurality of lower redistribution via patterns, a lower equipotential plate, and a lower redistribution insulating layer, wherein the lower redistribution layer comprises a signal wiring layer and a lower wiring layer under the signal wiring layer, wherein a pair of differential signal wiring lines are provided in the plurality of lower redistribution line patterns in the signal wiring layer, wherein the lower equipotential plate is provided in the lower wiring layer, and wherein the pair of differential signal wiring lines comprises a first differential signal wiring line and a second differential signal wiring line which are spaced apart from each other;
an expanded layer overlapping portions of the pair of differential signal wiring lines along a vertical direction on the lower redistribution layer, the expanded layer comprising a substrate base having a mounting space, a plurality of wiring patterns and an upper equipotential plate on a surface of the substrate base, and a plurality of conductive vias passing through at least a portion of the substrate base, wherein the expanded layer has an upper wiring layer in which the upper equipotential plate is provided; and
a semiconductor chip provided on the lower redistribution layer in the mounting space,
wherein the lower redistribution layer comprises a first wiring insulating layer surrounding the pair of differential signal wiring lines, and a second wiring insulating layer,
the pair of differential signal wiring lines and the second wiring insulating layer are spaced apart from each other, and
a first relative dielectric constant of the first wiring insulating layer is less than a second relative dielectric constant of the second wiring insulating layer.

10. The semiconductor package of claim 9, wherein a first thickness of the first wiring insulating layer is greater than a second thickness of the signal wiring layer, and
a first horizontal width of the first wiring insulating layer is greater than a second horizontal width of the pair of differential signal wiring lines.

11. The semiconductor package of claim 9, wherein the lower redistribution layer further comprises a single signal wiring line provided in the signal wiring layer and spaced apart from the pair of differential signal wiring lines, and
the single signal wiring line overlaps each of the lower equipotential plate and the upper equipotential plate along the vertical direction.

12. The semiconductor package of claim 11, wherein the single signal wiring line is in direct contact with the second wiring insulating layer.

13. The semiconductor package of claim 9, wherein the lower equipotential plate and the upper equipotential plate respectively define a lower impedance opening and an upper impedance opening which overlap at least a portion of the pair of differential signal wiring lines along the vertical direction.

14. The semiconductor package of claim 13, wherein the first wiring insulating layer fills at least a portion of the lower impedance opening and the upper impedance opening.

15. The semiconductor package of claim 13, wherein the lower redistribution layer further comprises a lower equipotential bridge that extends in the lower wiring layer to bisect the lower impedance opening,
an upper equipotential bridge extends in the upper wiring layer to bisect the upper impedance opening, and
the lower equipotential bridge and the upper equipotential bridge overlap a space between the first differential signal wiring line and the second differential signal wiring line along the vertical direction.

16. The semiconductor package of claim 9, wherein the first wiring insulating layer is provided in at least two redistribution insulating layers of a plurality of redistribution insulating layers.

17. The semiconductor package of claim 9, wherein the pair of differential signal wiring lines electrically connect the semiconductor chip, the plurality of wiring patterns, and a portion of the plurality of conductive vias.

18. A semiconductor package comprising:
a first semiconductor package comprising a lower redistribution layer, an expanded layer, a first semiconductor chip, and an upper redistribution layer, the lower redistribution layer comprising a surrounding equipotential plate which defines a differential signal opening, a signal wiring layer inside the differential signal opening, and a lower wiring layer in which a lower equipotential plate is provided, wherein a pair of differential signal wiring lines is provided in the signal wiring layer and comprises a first differential signal wiring line and a second differential signal wiring line which extend apart from each other, wherein the lower redistribution layer comprises a lower redistribution insulating layer, wherein the expanded layer overlaps portions of the pair of differential signal wiring lines along a vertical direction on the lower redistribution layer, wherein the expanded layer comprises a substrate base having a mounting space, a plurality of wiring patterns and an upper equipotential plate on at least one of a top surface and a bottom surface of the substrate base, and a plurality of conductive vias passing through at least a portion of the substrate base, wherein the expanded layer has an upper wiring layer in which the upper equipotential plate is provided over the signal wiring layer, the first semiconductor chip inside the mounting space on the lower redistribution layer, and the upper redistribution layer on the expanded layer and the first semiconductor chip, wherein the upper redistribution layer comprises a plurality of upper redistribution line patterns, a plurality of upper redistribution via patterns, and an upper redistribution insulating layer; and
a second semiconductor package stacked on the first semiconductor package and comprising a second semiconductor chip electrically connected to the first semiconductor chip through the pair of differential signal wiring lines, and a package connection terminal attached to a package connection pad that is a portion of the plurality of upper redistribution via patterns, to electrically connect the second semiconductor chip to the first semiconductor package,
wherein the lower redistribution layer comprises a first wiring insulating layer and a second wiring insulating layer which surround the pair of differential signal wiring lines,
the pair of differential signal wiring lines and the second wiring insulating layer are spaced apart from each other, and
a first relative dielectric constant of the first wiring insulating layer is less than a second relative dielectric constant of the second wiring insulating layer.

19. The semiconductor package of claim 18, wherein the first relative dielectric constant ranges from 0.5 to 2.5, and the second relative dielectric constant ranges from 2.5 to 5.

20. The semiconductor package of claim 18, wherein a horizontal width of the first wiring insulating layer ranges from 15 μm to 500 μm, and a thickness of the first wiring insulating layer ranges from 3 μm to 100 μm.

* * * * *